(12) United States Patent
Sanford et al.

(10) Patent No.: US 9,781,846 B2
(45) Date of Patent: Oct. 3, 2017

(54) ELECTRONIC DEVICE ASSEMBLY

(75) Inventors: Emery Sanford, San Francisco, CA (US); Stephen Brian Lynch, Portola Valley, CA (US); Anthony Sagala Montevirgen, Milpitas, CA (US); Fletcher Rothkopf, Los Altos, CA (US); Mathias Schmidt, San Jose, CA (US); Hamid Mohammadinia, San Jose, CA (US); R. Sean Murphy, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 383 days.

(21) Appl. No.: 13/216,357

(22) Filed: Aug. 24, 2011

(65) Prior Publication Data

US 2011/0305875 A1     Dec. 15, 2011

Related U.S. Application Data

(62) Division of application No. 12/205,551, filed on Sep. 5, 2008, now Pat. No. 8,023,261.

(51) Int. Cl.
*G02B 5/00* (2006.01)
*G04B 37/00* (2006.01)
*H05K 5/00* (2006.01)

(52) U.S. Cl.
CPC ...... *H05K 5/0013* (2013.01); *Y10T 29/49826* (2015.01); *Y10T 428/24628* (2015.01)

(58) Field of Classification Search
CPC .................................. G02B 5/00; G04B 37/00
(Continued)

(56) References Cited

U.S. PATENT DOCUMENTS

D118,749 S  *  1/1940  Zimmerman ................. D26/120
D124,596 S  *  1/1941  Arenberg ..................... D26/120
(Continued)

FOREIGN PATENT DOCUMENTS

CN         101379459 A        3/2009
CN         101722635 A        6/2010
(Continued)

OTHER PUBLICATIONS

U.S. Appl. No. 10/884,172, filed Jul. 2, 2004 (Zadesky et al.).
(Continued)

*Primary Examiner* — Robert Rose
(74) *Attorney, Agent, or Firm* — Brownstein Hyatt Farber Schreck, LLP

(57) ABSTRACT

Apparatus and methods for assembling an electronic device and components thereof are provided. The electronic device may include a housing and a cover inserted into an opening in the housing. The electronic device may also include a first assembly that may be inserted into the housing through a first end, and a second assembly that may be inserted into the housing through a second end. The electronic device may also include end cap assemblies. In some embodiments, the electronic device may include an input mechanism coupled to the housing and a plate coupled to the housing. In some embodiments, a connector of the electronic device may be mounted on a circuit board by inserting a fixture into the connector, mounting the connector to a portion of the circuit board, removing the fixture from the connector, and separating the portion of the circuit board from another portion of the circuit board.

22 Claims, 18 Drawing Sheets

(58) Field of Classification Search
USPC ............ 361/679.01, 679.02, 679.08, 679.09, 361/679.26–679.29, 679.3, 361/679.55–679.59; 248/917–924; 206/307; 451/41
See application file for complete search history.

(56) References Cited

U.S. PATENT DOCUMENTS

| | | | |
|---|---|---|---|
| 2,269,554 A * | 1/1942 | Rolph | 362/311.06 |
| 4,403,224 A | 9/1983 | Wirnowski | |
| 4,522,508 A | 6/1985 | Meister | |
| 4,995,941 A | 2/1991 | Nelson et al. | |
| 5,394,306 A | 2/1995 | Koenck et al. | |
| 5,456,955 A | 10/1995 | Muggli | |
| 5,514,319 A | 5/1996 | Young | |
| 5,613,237 A | 3/1997 | Bent et al. | |
| 5,681,515 A | 10/1997 | Pratt et al. | |
| 5,867,149 A | 2/1999 | Jaeger | |
| 5,932,329 A | 8/1999 | Frost et al. | |
| 6,058,293 A | 5/2000 | Phillips | |
| 6,206,563 B1 | 3/2001 | Dombre et al. | |
| 6,229,993 B1 | 5/2001 | Greenaway et al. | |
| 6,266,685 B1 | 7/2001 | Danielson et al. | |
| 6,323,846 B1 | 11/2001 | Westerman et al. | |
| 6,462,890 B2 * | 10/2002 | Hsu | 359/738 |
| 6,510,226 B1 | 1/2003 | Thomann et al. | |
| 6,532,152 B1 | 3/2003 | White et al. | |
| 6,560,092 B2 | 5/2003 | Itou et al. | |
| 6,777,621 B2 | 8/2004 | Ishikawa et al. | |
| 6,796,708 B2 | 9/2004 | Kawamata et al. | |
| 6,825,751 B1 | 11/2004 | Kita et al. | |
| 6,842,288 B1 | 1/2005 | Liu et al. | |
| 6,876,543 B2 | 4/2005 | Mockridge et al. | |
| 6,965,789 B2 | 11/2005 | Hauge et al. | |
| 6,980,095 B2 | 12/2005 | Wright et al. | |
| 7,031,148 B1 * | 4/2006 | Lin | 361/679.08 |
| 7,046,230 B2 | 5/2006 | Zadesky et al. | |
| 7,073,916 B2 | 7/2006 | Yin et al. | |
| 7,113,237 B2 | 9/2006 | Nitto et al. | |
| 7,236,588 B2 | 6/2007 | Gartrell | |
| 7,595,983 B2 | 9/2009 | Okuda | |
| D606,539 S | 12/2009 | Liao et al. | |
| 7,636,244 B2 | 12/2009 | Kriege et al. | |
| 7,697,269 B2 | 4/2010 | Yang et al. | |
| 7,697,281 B2 | 4/2010 | Dabov et al. | |
| 7,711,256 B2 | 5/2010 | Wun | |
| 7,872,861 B2 | 1/2011 | Ou et al. | |
| 7,933,123 B2 | 4/2011 | Wang et al. | |
| 8,004,835 B2 | 8/2011 | Conti et al. | |
| 8,023,261 B2 * | 9/2011 | Sanford et al. | 361/679.55 |
| 8,238,087 B2 | 8/2012 | McClure et al. | |
| 8,254,098 B2 | 8/2012 | Liu et al. | |
| 8,320,978 B2 | 11/2012 | Chang et al. | |
| 8,797,721 B2 | 8/2014 | Pakula et al. | |
| 9,185,816 B2 | 11/2015 | Pakula et al. | |
| 9,235,240 B2 | 1/2016 | Pakula et al. | |
| 2002/0172017 A1 | 11/2002 | Tarnowski | |
| 2003/0006128 A1 | 1/2003 | Giles et al. | |
| 2003/0045246 A1 | 3/2003 | Lee et al. | |
| 2003/0108720 A1 | 6/2003 | Kashino | |
| 2003/0164905 A1 | 9/2003 | Yamaoka et al. | |
| 2003/0184894 A1 * | 10/2003 | Bischof et al. | 359/894 |
| 2004/0022017 A1 | 2/2004 | Chuang | |
| 2004/0042168 A1 | 3/2004 | Yang et al. | |
| 2004/0079457 A1 | 4/2004 | Kimura et al. | |
| 2005/0030707 A1 | 2/2005 | Richardson | |
| 2005/0052425 A1 | 3/2005 | Zadesky et al. | |
| 2005/0062902 A1 | 3/2005 | Fukayama | |
| 2005/0083308 A1 | 4/2005 | Homer et al. | |
| 2005/0130721 A1 | 6/2005 | Gartrell | |
| 2005/0285991 A1 | 12/2005 | Yamazaki | |
| 2005/0286214 A1 | 12/2005 | Chen | |
| 2006/0055839 A1 | 3/2006 | Hirao et al. | |
| 2006/0132644 A1 | 6/2006 | Shangguan et al. | |
| 2006/0158839 A1 | 7/2006 | Deluga | |
| 2006/0197750 A1 | 9/2006 | Kerr et al. | |
| 2006/0239746 A1 | 10/2006 | Grant | |
| 2006/0268528 A1 * | 11/2006 | Zadesky et al. | 361/728 |
| 2007/0025072 A1 | 2/2007 | Liao | |
| 2007/0052679 A1 | 3/2007 | Liang | |
| 2007/0173299 A1 | 7/2007 | Sawayama et al. | |
| 2007/0257398 A1 | 11/2007 | Moncrieff | |
| 2008/0062660 A1 | 3/2008 | Weber et al. | |
| 2008/0092809 A1 | 4/2008 | Lin et al. | |
| 2008/0131683 A1 | 6/2008 | Ristic-Lehmann et al. | |
| 2008/0146293 A1 | 6/2008 | Kim et al. | |
| 2008/0166009 A1 | 7/2008 | Dinh et al. | |
| 2008/0206492 A1 | 8/2008 | Husemann et al. | |
| 2008/0239647 A1 | 10/2008 | Luo et al. | |
| 2008/0264548 A1 | 10/2008 | Zhang | |
| 2008/0266766 A1 | 10/2008 | D'Urso et al. | |
| 2008/0316117 A1 | 12/2008 | Hill et al. | |
| 2009/0002930 A1 | 1/2009 | Nakanishi et al. | |
| 2009/0046072 A1 | 2/2009 | Emig et al. | |
| 2009/0046240 A1 | 2/2009 | Bolton | |
| 2009/0054115 A1 | 2/2009 | Horrdin et al. | |
| 2009/0059485 A1 | 3/2009 | Lynch et al. | |
| 2009/0059502 A1 | 3/2009 | Filson et al. | |
| 2009/0065136 A1 | 3/2009 | Nadella et al. | |
| 2009/0067141 A1 | 3/2009 | Dabov et al. | |
| 2009/0093575 A1 | 4/2009 | Kabashima et al. | |
| 2009/0245564 A1 | 10/2009 | Mittleman et al. | |
| 2009/0257189 A1 | 10/2009 | Wang et al. | |
| 2009/0257207 A1 | 10/2009 | Wang et al. | |
| 2009/0264160 A1 | 10/2009 | Mochizuki et al. | |
| 2009/0296325 A1 | 12/2009 | Morimoto et al. | |
| 2010/0014232 A1 | 1/2010 | Nishimura | |
| 2010/0060563 A1 | 3/2010 | Hayton et al. | |
| 2010/0061040 A1 | 3/2010 | Dabov et al. | |
| 2010/0061044 A1 | 3/2010 | Zou et al. | |
| 2010/0089729 A1 | 4/2010 | Li et al. | |
| 2010/0091442 A1 | 4/2010 | Theobald et al. | |
| 2010/0120480 A1 | 5/2010 | Jung | |
| 2010/0149410 A1 | 6/2010 | Matsuzawa | |
| 2010/0190530 A1 | 7/2010 | Wada et al. | |
| 2010/0203924 A1 | 8/2010 | Hirota | |
| 2010/0269891 A1 | 10/2010 | Kinard et al. | |
| 2010/0283394 A1 | 11/2010 | Ong | |
| 2010/0315570 A1 | 12/2010 | Mathew et al. | |
| 2011/0050053 A1 | 3/2011 | Deng | |
| 2011/0050054 A1 | 3/2011 | Chang et al. | |
| 2011/0086676 A1 | 4/2011 | Choi et al. | |
| 2011/0096483 A1 | 4/2011 | Sapper et al. | |
| 2011/0136553 A1 | 6/2011 | Jo | |
| 2011/0164365 A1 | 7/2011 | McClure et al. | |
| 2011/0165361 A1 | 7/2011 | Sherman et al. | |
| 2011/0186345 A1 | 8/2011 | Pakula et al. | |
| 2011/0187245 A1 | 8/2011 | Pakula et al. | |
| 2011/0188180 A1 | 8/2011 | Pakula et al. | |
| 2011/0215685 A1 | 9/2011 | Jarvis et al. | |
| 2011/0255218 A1 | 10/2011 | Pakula et al. | |
| 2011/0255227 A1 | 10/2011 | Murakami | |
| 2012/0113611 A1 | 5/2012 | Maniar et al. | |
| 2012/0118628 A1 | 5/2012 | Pakula et al. | |
| 2012/0275088 A1 | 11/2012 | Huang | |
| 2016/0054537 A1 | 2/2016 | Pakula et al. | |
| 2016/0062398 A1 | 3/2016 | Pakula et al. | |

FOREIGN PATENT DOCUMENTS

| | | |
|---|---|---|
| CN | 101518168 A | 12/2011 |
| CN | 101458408 A | 1/2012 |
| EP | 0458016 A1 | 11/1991 |
| JP | 6-94848 | 4/2004 |
| JP | A 2006-276623 | 10/2006 |
| JP | A 2008-518807 | 6/2008 |
| JP | A 2009/259908 | 11/2009 |
| JP | A 2010-091742 | 4/2010 |
| WO | WO 2008/035736 | 3/2008 |
| WO | 2009/024842 A1 | 2/2009 |
| WO | 2009/126480 A2 | 10/2009 |
| WO | 2010/033571 | 3/2010 |
| WO | 2010/101961 A2 | 9/2010 |
| WO | WO 2010/074144 | 12/2011 |

(56) References Cited

FOREIGN PATENT DOCUMENTS

OTHER PUBLICATIONS

U.S. Appl. No. 12/180,315, filed Jul. 25, 2008 (Sanford).
Lu, "Liquid Optically Clear Adhesives for display Applications", Henkeina.com, Apr. 1, 2001, pp. 1-4.
Henkel, "Loctite Liquid Optically Clear Adhesives", Henkeina.com, downloaded Mar. 18, 2013, pp. 1-2.

\* cited by examiner

ELECTRONIC DEVICE ASSEMBLY

CROSS-REFERENCE TO RELATED APPLICATIONS

This application is a divisional of U.S. patent application Ser. No. 12/205,551, filed Sep. 5, 2008, which is fully incorporated by reference herein in its entirety.

FIELD OF THE INVENTION

This invention relates to components for an electronic device and methods for assembling the same.

BACKGROUND OF THE DISCLOSURE

The outward appearance of an electronic device, including its design and its heft, is important to a user of the electronic device, as the outward appearance contributes to the overall impression that the user has of the electronic device. At the same time, the assembly of the electronic device is also important to the user, as a durable assembly will help extend the overall life of the electronic device and will increase its value to the user.

Therefore, it would be beneficial to provide an electronic device that is aesthetically pleasing and lightweight, yet durable. It would also be beneficial to provide methods for assembling the electronic device.

SUMMARY OF THE DISCLOSURE

Apparatus and methods for assembling an electronic device and certain components of the electronic device are provided. In one embodiment of the invention, a method for assembling an electronic device is provided. The method may include providing a housing including a first open end and a second open end opposite the first open end, a cavity extending between the first open end and the second open end, and an opening positioned in a housing wall of the housing between the first open end and the second open end. The method may include inserting a first assembly into the cavity through the first open end, inserting at least a portion of a second assembly into the cavity through the second open end, wherein at least a remaining portion of the second assembly may be positioned outside the housing, and operatively coupling the first assembly to the second assembly through the opening.

In one embodiment of the invention, an electronic device is provided. The electronic device may include a housing, wherein the housing may include a first end, a second end opposite the first end, and an opening positioned in the housing between the first end and the second end. The electronic device may include a cover disposed within the opening, a first assembly located in the housing relative to the first end, and a second assembly located in the housing relative to the second end. The second assembly may be operatively coupled to the first assembly in the region of the opening.

In one embodiment of the invention, a system for coupling a connector to a circuit board is provided. The system may include a fixture including a first leg and a second leg, wherein the fixture may be configured to engage the first leg and the second leg to the connector, support the connector as the connector is coupled to a first portion of the circuit board, and disengage the first leg and the second leg from the connector.

In one embodiment of the invention, a method for mounting a connector on a circuit board is provided. The method may include inserting a fixture into the connector, mounting the connector to a first portion of the circuit board, removing the fixture from the connector, and separating the first portion of the circuit board from a second portion of the circuit board.

In one embodiment of the invention, a method of providing a cover for an electronic device is provided. The method may include machining the cover and at least one flange along a first edge of the cover from a single piece of material, creating at least a first chamfer in at least a second edge of the cover, grinding a surface of the cover to create a spline along the surface, inserting the cover into a polishing structure, and polishing the surface of the cover and the at least a first chamfer.

In one embodiment of the invention, an electronic device is provided. The electronic device may include a housing having a curved outer housing surface, an input mechanism having an outer contact surface, and a display having an outer display surface. The outer contact surface and the outer display surface may be flush with the curved outer housing surface.

In one embodiment of the invention, a method for assembling an input mechanism is provided. The method may include positioning a pad comprising at least a first flange and at least a first notch on a substrate. The method may include aligning a first part with respect to the pad, wherein the first part may include at least a first tab configured to fit within the at least a first notch. The method also may include aligning a second part with respect to the pad and the first part, wherein the second part may include at least a first depression and an opening. The at least a first flange may be configured to fit within the at least a first depression, and the first part may be configured to fit within the opening. The method also may include removing the pad from the substrate.

BRIEF DESCRIPTION OF THE DRAWINGS

The above and other aspects and advantages of the invention will become more apparent upon consideration of the following detailed description, taken in conjunction with the accompanying drawings, in which like reference characters refer to like parts throughout, and in which.

DETAILED DESCRIPTION OF THE DISCLOSURE

Figure 1:
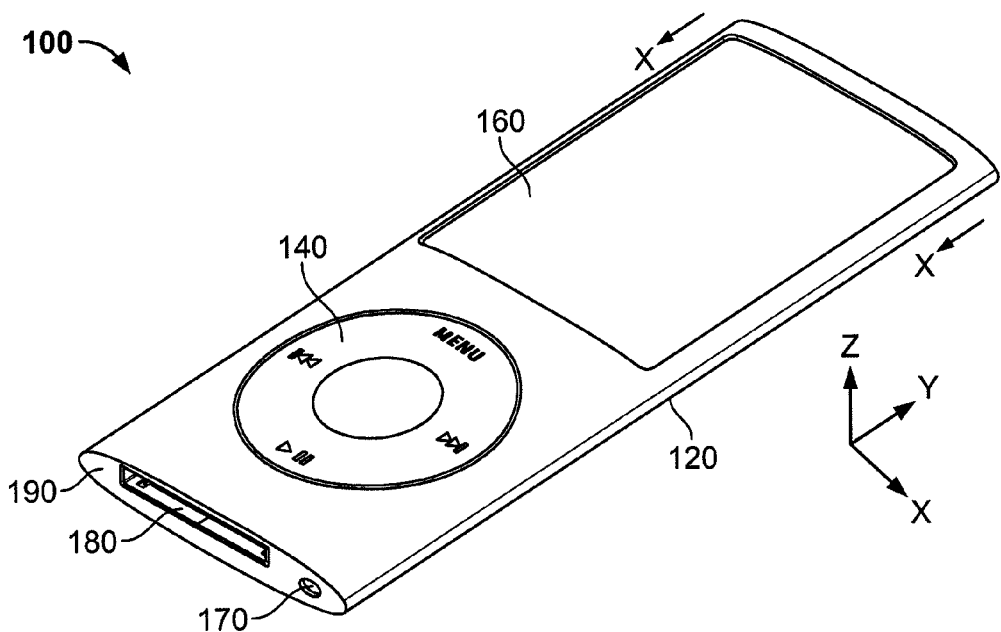
FIG. 1 is a bottom, front, right perspective view of an electronic device in accordance with some embodiments of the invention.

Apparatus and methods for assembling an electronic device and certain components of the electronic device are provided. In some embodiments, the electronic device may include any suitable components, including for example, a housing, an input mechanism, a plate, a cover, a second assembly including an output mechanism, a first assembly including a battery, circuitry, and a connector, end caps, and any other suitable components. Each component of the electronic device may be grounded to the housing.

In some embodiments, the housing may be extruded from a single piece of material (e.g., anodized aluminum) and may be of any suitable shape, including for example an elliptical shape. The housing may include any suitable cross-section and be of any suitable dimensions to accommodate all of the necessary components of the electronic device. In some embodiments, the housing may include an asymmetrical cross-section except at the ends of the housing, which may be machined to incorporate a cross-section that may correspond to the exterior shape of the housing.

In some embodiments, the input mechanism may include any suitable mechanism for providing inputs or instructions to an electronic device. For example, the input mechanism may include a click wheel. The input mechanism may include any suitable components, including for example, a wheel, a button, and a pad to prevent the wheel and button from losing their alignment with respect to the pad when the wheel or the button is manipulated. The outer face of the input mechanism may be curved to mimic the outward contour of the housing. In some embodiments, the input mechanism may be coupled to any suitable mechanism, such as a plate. The plate may be manufactured to provide sufficient resistance against manipulation of the input mechanism and may be etched to provide depressions for sufficient clearance for other components of the electronic device.

In some embodiments, the electronic device may include a cover to protect an output mechanism. The cover may be manufactured from any suitable material, including for example glass, and may be manufactured (e.g., polished) to mimic the outward contour of the housing. The cover may also include any suitable features, such as flanges, that may enable the cover to be positioned with reference to the housing. The cover may be positioned over the output mechanism, which may include any suitable means for presenting information (e.g., textual, graphical, audible, and/or tactile information) to a user of the electronic device. For example, the output mechanism may include a screen (e.g., a liquid crystal display).

In some embodiments, the electronic device may include any suitable connector, including for example a 30-pin connector, for electrically connecting to any suitable component, such as a charging dock, a cable, or any other component that may provide power or receive and transfer data or other information. The 30-pin connector may be mounted to any suitable surface with which the 30-pin connector may receive and transmit information, such as a circuit board panel. The 30-pin connector may be mounted to the panel with the aid of a fixture, which may be made of any suitable material (e.g., plastic). The fixture may be designed to be inserted into the 30-pin connector to provide vertical support during the mounting process and to prevent the 30-pin connector from rotating away from the circuit board panel.

The electronic device may be assembled in any suitable manner. For example, a housing may be extruded and an input mechanism may be coupled to the housing and to a plate. The first assembly, which may include a battery coupled to a frame, to which the circuit board panel and the connector may also be coupled, may be inserted into the housing through the bottom end of the housing and, in some embodiments, may be inserted underneath the input mechanism and plate. In some embodiments, an audio jack may also be coupled to the first assembly before the first assembly is inserted into the housing. In some embodiments, the audio jack may be inserted into the housing after the first assembly has been inserted. The second assembly may be inserted at least partially into the housing, so that a connector (e.g., a ZIF or zero insertion force connector) from the second assembly may be connected to a flex circuit from the first assembly through an opening for the cover in the housing. This connection may allow the second assembly to communicate with the first assembly. The cover, including one of the flanges of the cover, may be inserted at least partially into the opening and into the housing toward the first assembly. The remaining portion of the cover may then be lowered into the opening and inserted in the opposite direction toward the end through which the output assembly may be at least partially exposed. After the cover has been inserted into the opening and has covered over the connection between the second assembly and the first assembly, the second assembly may be inserted completely into the housing.

End cap assemblies may be inserted into both ends of the housing in any suitable manner to complete the assembly of the electronic device. For example, an end cap assembly, including an end cap, screws, an adhesive layer, and a cosmetic end cap may be inserted into the housing. In some embodiments, some of the screws may be inserted through any suitable components (e.g., the audio jack, a frame that may enclose the output mechanism) into the housing at any suitable angle. At least one of the screws may be used to couple the audio jack to the connector and the end cap, thereby grounding the connector to the housing. The cosmetic end cap may be adhered to the end cap to protect the end caps and screws and to provide an aesthetically pleasing finish to a user of the electronic device. At the end of the housing where the connector and the audio jack may be positioned, the end cap assembly may include openings to permit a user to access the connector and the audio jack. At the opposite end of the housing, a hold switch or any other suitable mechanism may protrude from the housing for use by the user.

Apparatus and methods for assembling an electronic device and certain components are provided and described with reference to FIGS. 1-14.

FIG. 1 is a bottom, front, right perspective view of an electronic device 100 in accordance with some embodiments of the invention. Electronic device 100 may be widely varied. In some embodiments, electronic device 100 may perform a single function (e.g., a device dedicated to playing and storing media) and, in other cases, the electronic device may perform multiple functions (e.g., a device that plays/stores media, receives/transmits telephone calls/text messages/internet, and/or performs web browsing). In some embodiments, the electronic device is capable of communicating wirelessly (with or without the aid of a wireless enabling accessory system) and/or via wired pathways (e.g., using traditional electrical wires). In some embodiments, the electronic device may be portable and more particularly extremely portable (e.g., small form factor, thin, low profile, lightweight). In some cases, the electronic device may be sized for being handheld. The electronic device may even be sized for one-handed operation and placement into small areas such as a pocket (i.e., electronic device 100 can be a handheld pocket sized electronic device).

By way of example, electronic device 100 may correspond to consumer electronic products such as computers, media players, personal digital assistants ("PDAs"), telecommunication devices (telephones), personal e-mail or messaging devices and/or the like. In one example, the electronic device may correspond to any of those electronic devices available by Apple Inc. of Cupertino, Calif., such as an iPod™, an iPod™ nano, an iPod™ shuffle, an iPod™ touch, or an iPhone™.

Electronic device 100 may include any suitable components, including but not limited to housing 120, input mechanism 140, cover 160, jack 170, connector 180, end cap 190, and any other suitable components. Line X-X may be positioned anywhere along a portion of electronic device 100 where cover 160 is positioned (see, e.g., FIG. 10).

Housing 120 may be configured to at least partially enclose any suitable number of components associated with the operation of electronic device 100. Housing 120 may define a cavity within which the components may be positioned and housing 120 also may physically support any suitable number of mechanisms, within housing 120 or within openings through the surface of housing 120. The cavity of housing 120 may be described further below with respect to FIG. 2.

Housing 120 may be fashioned to partially enclose any suitable number of mechanisms. For example, input mechanism 140 and cover 160 may each be partially enclosed within housing 120 and may also open onto the top surface of housing 120.

Housing 120 may also partially enclose connector 180 and jack 170 (e.g., an audio jack for coupling headphones to electronic device 100), which may be positioned within housing 120 although a portion of connector 180 and a portion of jack 170 may open to the exterior of housing 120. Connector 180 and jack 170 may be exposed through any suitable closure of housing 120 that may help to protect the components in housing 120, including for example, cosmetic end cap 190. Housing 120 may include a top end cap (not shown) on the opposite end of housing 120.

Housing 120 may also define at least in part the outward appearance of electronic device 100. For example, housing 120 may be formed into an oval or elliptical shape, although the cavity within housing 120 may include any suitable shape. Electronic device 100 may be symmetrical about both the X and Y axes. In some embodiments, housing 120 may include any other suitable shape, including, but not limited to, a shape that is substantially spherical, hexahedral, conoidal, octahedral, or a combination thereof. Housing 120 may be of any suitable dimensions. In some embodiments, housing 120 may be 90.7 millimeters long (along the Y-axis), 38.69 millimeters wide (along the X-axis), and 6.2 millimeters thick (along the Z-axis). Housing 120 may also include any suitable volume. For example, housing 120 may include a total external volume of 18,518 cubic millimeters.

Housing 120 may be formed in any suitable manner. For example, a single piece of metal material (e.g., anodized aluminum) may be machined, or extruded, to create housing 120 with a cavity for inserting the components of electronic device 100. The size of housing 120 and the shape of its cavity may be driven by the need to enclose the largest component of electronic device 100. For example, housing 120 may be extruded such that the cavity within housing 120 may enclose an output mechanism (e.g., a display screen) having a diagonal diameter of two inches. Alternatively, housing 120 may be formed from multiple pieces of material (e.g., metal) that may be fused or welded together to create a single structure. Alternatively, a single sheet of metal may be formed into a housing with a cavity for holding the internal components of electronic device 100. In some embodiments, housing 120 may be formed from any other suitable materials, including but not limited to, ceramics, plastics, or metals, including steel, copper, titanium, or any suitable type of metal alloy.

Housing 120 also may include any suitable number of openings. For example, housing 120 may include an opening through which cover 160 may be at least partially inserted to protect an output mechanism and other components assembled with the output mechanism. Similarly, housing 120 may include an opening through which input mechanism 140 may be partially exposed for manipulation by a user of electronic device 100. In addition, housing 120 may include openings at either end of housing 120, to permit insertion of the components during assembly of electronic device 100 and to permit certain components to be exposed to a user, including for example connector 180, jack 170 and any other suitable component (e.g., a hold switch on the top of electronic device 100, not shown).

As mentioned, electronic device 100 may include an input mechanism 140 accessible at the surface of electronic device 100. Input mechanism 140 may for example be positioned within housing 120. Input mechanism 140 may include any suitable mechanism for providing inputs or instructions to electronic device 100. Input mechanism 140 may be configured to provide one or more dedicated control functions for making selections or issuing commands associated with electronic device 100. Input mechanism 140 may take a variety of forms, such as an electronic device pad, touch screen, one or more buttons (e.g., a keyboard), mouse, joystick, track ball, keypad, dial, switch, actuator, touch pad, scroll wheel, click wheel, or combinations thereof. Examples of touch pads and wheels may be found in Zadesky et al., U.S. Pat. No. 7,046,230, issued May 16, 2006, and Zadesky et al., U.S. Patent Publication No. 2005/0052425, published Mar. 10, 2005, each of which is incorporated by reference herein in its entirety. The user interface may include a multi-touch screen, such as that described in Westerman et al., U.S. Pat. No. 6,323,846, issued Nov. 27, 2001, which is incorporated by reference herein in its entirety.

In one embodiment, input mechanism 140 may be a pad that may follow the shape and contour of housing 120. For example, the outer surface of the pad may include substantially the same spline and/or curvature as housing 120 such that input mechanism 140 may be substantially flush with housing 120 (e.g., the interface is continuous).

Although not shown, electronic device 100 may include any suitable mechanism for supporting input mechanism 140 relative to housing 120. For example, input mechanism 140 may be coupled to a plate that may be capable of fixing input mechanism 140 in place with respect to housing 120.

Electronic device 100 may include a cover 160 to protect an output mechanism and/or any other suitable component within housing 120. Cover 160 may, for example, be a transparent or semitransparent window that overlays or covers a display (not shown) enclosed within housing 120. The display may for example be a liquid crystal display ("LCD") or an organic light emitting diode ("OLED") display. By way of example, cover 160 may be formed from plastic, glass, or any other suitable material.

In one embodiment, the outer surface of cover 160 may follow the shape and contour of housing 120. For example, the outer surface of cover 160 may include substantially the same spline and/or curvature as housing 120 such that cover 160 may be substantially flush with housing 120 (e.g., the interface is continuous).

Electronic device 100 may include a connector 180 for electrically connecting to any suitable component, such as a charging dock, a cable, or any other component that may provide power or receive and transfer data or other information.

Several exemplary embodiments of various features of the electronic device will be described below. For example, an input mechanism will be described further below with respect to FIGS. 3A-3B, a plate will be described further below with respect to FIGS. 4A-4B, a cover will be described further below with respect to FIGS. 5A-5D, a connector will be described further with respect to FIGS. 6A-6E, and a cosmetic end cap will be described further with respect to FIG. 11.

Figure 2:
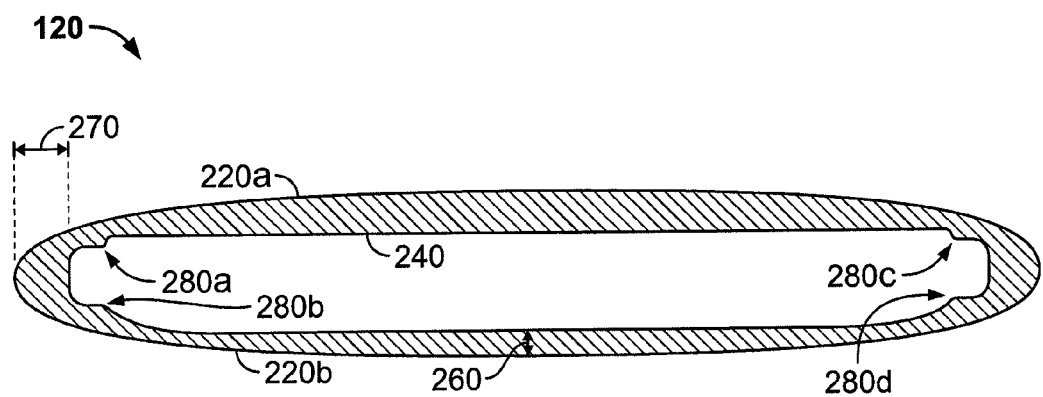
FIG. 2 is a partial cross-sectional view of a housing of the electronic device of FIG. 1 in accordance with some embodiments of the invention.

FIG. 2 is a partial cross-sectional view of housing 120 in accordance with some embodiments of the invention. The cross-sectional view may be from the perspective of one looking into housing 120 from either the bottom or the top of electronic device 100. Surface 220a may represent the top surface of the electronic device and surface 220b may represent the bottom surface of the electronic device, each of which may have the same spline, or degree of curvature. The substantially symmetrical exterior of housing 120 may be formed (e.g., extruded) to provide an aesthetically pleasing visual appearance for the electronic device. Surface 220 may be the surface through which input mechanism 140 and cover 160 may be at least partially exposed (not shown). Surface 240 may define the inner edge of the cavity of housing 120. The asymmetrical interior of housing 120 may be formed (e.g., extruded) to provide sufficient clearance for the component with the largest width within the electronic device (e.g., the output mechanism) as well as sufficient clearance for all of the components based on the position of each component within housing 120. For example, housing 120 may be thinner along the bottom of the cavity to accommodate the battery of the electronic device. Along a portion of surface 240 (e.g., between notches 280b and 280d), housing 120 may narrow to include any suitable thickness 260. In some embodiments, thickness 260 may be in the range of 0.3 millimeters to 0.4 millimeters, preferably 0.35 millimeters. At the corners of housing 120, the corners may include any suitable thickness 270. In some embodiments, thickness 270 may be approximately 1.53 millimeters to better protect the components within housing 120 if the electronic device is dropped.

Figure 8:
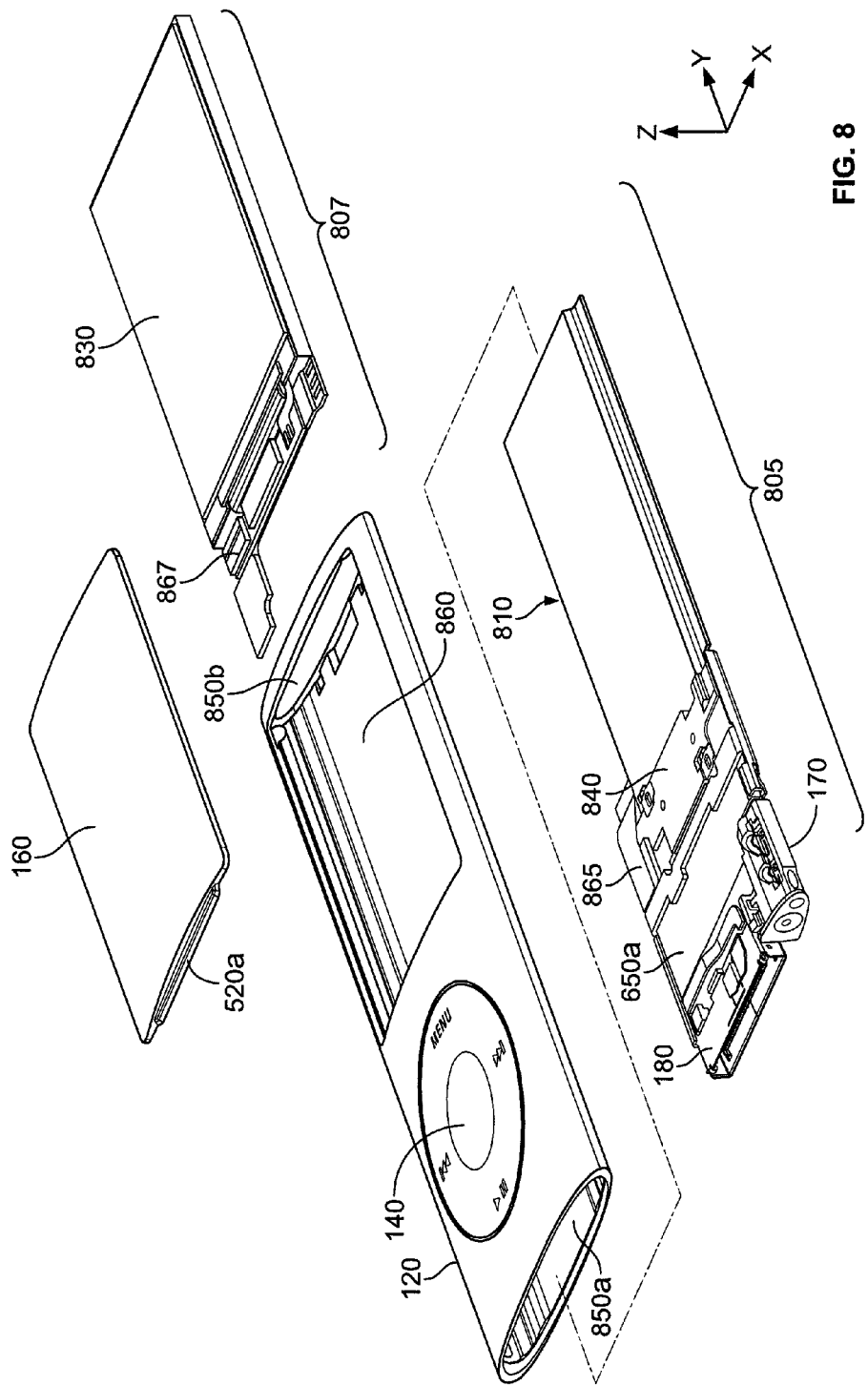
FIG. 8 is an exploded bottom, front, right perspective view of an assembly of the electronic device of FIG. 1 in accordance with some embodiments of the invention.

Surface 240 may include the same cross-sectional profile through most of the length of housing 120, with the exception of a portion of housing 120 near the top and bottom edges of housing 120. In some embodiments, housing 120 may be formed (e.g., machined) up to a depth of two millimeters into the top and bottom edges of housing 120 to produce an oval cross-section that may permit insertion of end caps (e.g., end caps 190) to protect the components within the electronic device. The oval cross-section of housing 120 at opening 850a and opening 850b is shown in FIG. 8. For example, housing 120 may be machined by any suitable device (e.g., a computer numerical control, or CNC, device) to a depth of 1.12 millimeters down from the top end of housing 120 such that the cavity may have an oval cross-section to permit insertion of a switch mechanism and an end cap assembly. Similarly, housing 120 may be machined by the CNC device to a depth of 1.42 millimeters up from the bottom end of housing 120 such that the cavity may also have an oval cross-section to permit insertion of connector 180, jack 170, and an end cap assembly (e.g., end cap 190). In both instances, notches 280a, 280b, 280c, and 280d may be removed by the additional machining so that the cavity of housing 120 may have an oval cross-section to a depth of 1.12 millimeters into housing 120 down from the top end of housing 120 (e.g., see opening 850*b* of FIG. 8) and to a depth of 1.42 millimeters into housing 120 up from the bottom end of housing 120 (e.g., see opening 850*a* of FIG. 8).

In some embodiments, those portions of notches 280*a*, 280*b*, 280*c*, and 280*d* that are not removed may form any suitable channels within housing 120. For example, a channel may be formed on one side of housing 120 between notches 280*a* and 280*b*, and another channel may be formed on another side of housing 120 between notches 280*c* and 280*d*. Similarly, a channel may be formed underneath surface 220*a* between notches 280*a* and 280*c*, and another channel may be formed underneath surface 220*b* between notches 280*b* and 280*d*. In some embodiments, one or more of these channels may help to guide one or more components as they may be inserted into housing 120 and may help to stabilize the one or more components.

Surface 240 may include any suitable features to allow for the components of the electronic device to sufficiently clear housing 120. For example, surface 240 may be flat-walled near top surface 220*a* so that a plate (e.g., gimbal plate 400 in FIGS. 4A-4B) may be uniformly coupled to surface 240 underneath an input mechanism (e.g., input mechanism 140 of FIGS. 3A-3B) using any suitable material, including for example an adhesive. Surface 240 may be curved near bottom surface 220*b* to permit a battery (e.g., battery 810 of FIG. 8) to fit within housing 120 and underneath the other components of electronic device 100.

Housing 120 may be extruded in any suitable manner and may include any suitable cross-section. For example, housing 120 may be formed from an extruded aluminum tube using an extrusion process that may create an integral tube without any seams, cracks, or breaks. The extrusion may include a shaping process where a continuous work piece may be produced by forcing molten or hot material through a shaped orifice. As a result, a length of a particular cross-section may be produced, where the cross-section may be controlled at least in part because of the shaped orifice. After the length has left the shaped orifice and cooled, the length may be cut to a desired length to form housing 120. In some embodiments, the interior cross-section of housing 120 may be asymmetrical or symmetrical. Alternatively or additionally, the exterior of housing 120 may be asymmetrical or symmetrical. The extrusion process to form housing 120 may include extrusion as described more fully in Zadesky et al., U.S. patent application Ser. No. 10/884,172, filed Jul. 2, 2004, and in Zadesky et al., U.S. Patent Publication No. 2006/0268528, published Nov. 30, 2006, each of which is incorporated by reference herein in its entirety.

Figure 3A:
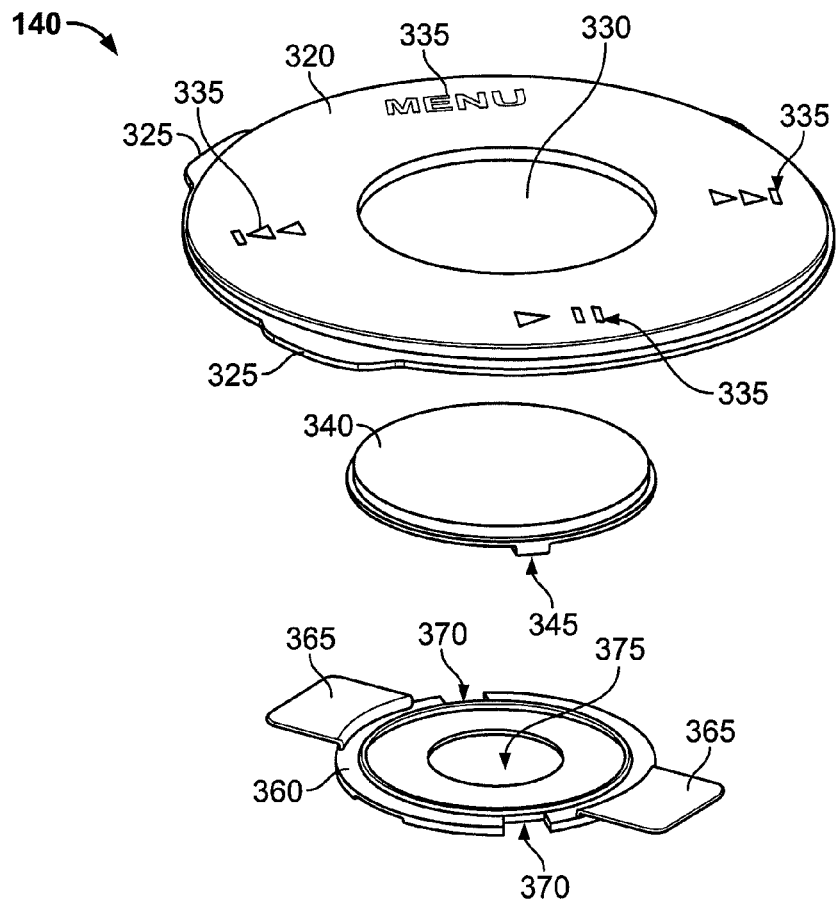
FIG. 3A is an exploded perspective view of the components of an input mechanism of the electronic device of FIG. 1 in accordance with some embodiments of the invention.

FIG. 3A is an exploded perspective view of the components of input mechanism 140 in accordance with some embodiments of the invention. Input mechanism 140 may include any suitable mechanism for providing inputs or instructions to electronic device 100. Input mechanism 140 may be configured to provide one or more dedicated control functions for making selections or issuing commands associated with electronic device 100. Although input mechanism 140 may take a variety of forms, in the illustrated embodiment, input mechanism 140 may be a click wheel and may include any suitable components, including for example wheel 320, button 340, and pad 360.

Each of wheel 320 and button 340 may include any suitable material, such as metal, plastic, ceramic, or the like, and may be of any suitable shape and thickness. For example, wheel 320 and button 340 may each be plastic, circular, and approximately the same thickness. Each of wheel 320 and button 340 may include a spline or curvature (e.g., the faces of wheel 320 and button 340 that may be exposed to a user of electronic device 100) so that wheel 320 and button 340, once assembled with housing 120, may correspond to the overall curvature of surface 220*a* and may provide a flush uniform surface with surface 220*a*. The degree of curvature of the outer face of wheel 320 may be greater than the degree of curvature of the outer face of button 340 because wheel 320 may span a greater distance across surface 220*a*.

Figure 3B:
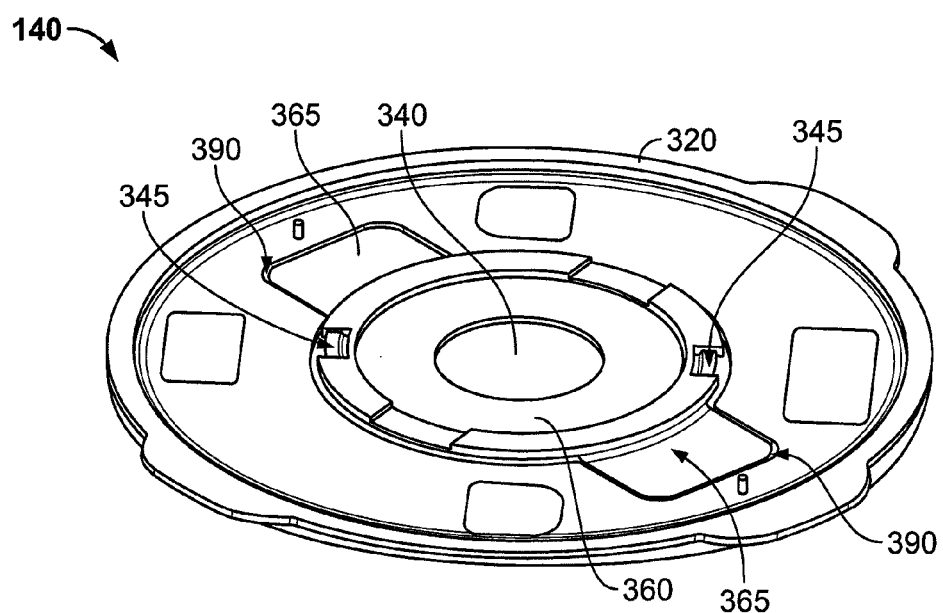
FIG. 3B is a bottom perspective view of the input mechanism of FIG. 3A assembled in accordance with some embodiments of the invention.

Wheel 320 may include any suitable number of features, such as flanges 325, that may enable wheel 320 to remain aligned with respect to a fixture described further below with respect to FIG. 3B. Wheel 320 may include any suitable number of flange depressions (not shown) on the underside of wheel 320 that may engage with flanges 365 to enable wheel 320 to remain aligned with respect to pad 360. Wheel 320 may include opening 330, through which button 340 may be exposed on the surface 220*a* to permit manipulation of button 340 by a user of electronic device 100. Wheel 320 may also include any suitable number of directions 335 that may guide the user in entering an appropriate input. For example, electronic device 100 may perform the function of playing music and directions 335 such as "play," "pause," "next," "back," and "menu," may guide the user in selecting media to be played on electronic device 100. Directions 335 may be of any suitable shading or color to be contrasted against the outer face of wheel 320. Button 340 may include any suitable number of features, such as tabs 345, that may enable button 340 to remain aligned with respect to pad 360 by engaging with notches 370.

Pad 360 may include any suitable material and may include any suitable features. For example, pad 360 may be made of a flexible silicone material to permit pad 360 to flex if a portion of wheel 320 or button 340 is manipulated (e.g., depressed) by a user of the electronic device. Pad 360 may also provide a user with a sensation of resistance in response to the depressing wheel 320 or button 340. Pad 360 may include any suitable number of flanges 365 that may enable pad 360 to remain aligned with respect to wheel 320. Pad 360 may include any suitable number of notches 370 that may engage with tabs 345 to enable pad 360 to remain aligned with respect to button 340. Pad 360 also may include opening 375. Once input mechanism 140 is assembled using wheel 320, button 340, and pad 360, opening 375 may enable button 340 to contact any suitable plate, including but not limited to, gimbal plate 400 of FIG. 4, when button 340 is depressed so that the electronic device may detect the depression.

Input mechanism 140 may be assembled using wheel 320, button 340, and pad 360 in any suitable manner. FIG. 3B is a bottom perspective view of input mechanism 140 assembled in accordance with some embodiments of the invention. In some embodiments, pad 360 may be positioned on any suitable substrate, such as a fixture. The fixture may include any suitable material and may be capable of being removed from pad 360 after input mechanism 140 has been assembled. The fixture may enable the components of input mechanism 140 to remain aligned with each other as input mechanism 140 is being assembled.

Button 340 may be positioned on pad 360 using any suitable means, including for example an adhesive. Button 340 may be aligned with respect to pad 360 by placing each tab 345 of button 340 within a corresponding notch 370 of pad 360. Wheel 320 may be positioned on button 340 using any suitable means, including for example an adhesive. Wheel 320 may be aligned with respect to pad 360 by placing each flange 365 of pad 360 within a corresponding flange depression 390 of wheel 320. It is to be understood that wheel 320, button 340, and pad 360 may include any suitable number of flanges, tabs, notches, depressions, or any other suitable features to enable the components of input mechanism 140 to remain aligned with respect to one another while being assembled on the fixture. When the components of input mechanism 140 have sufficiently adhered to one another, the fixture may be removed from pad 360 and the components may retain their alignment.

Any suitable mechanism can be used for supporting input mechanism 140. For example, input mechanism 140 may be coupled to any suitable plate that may be capable of fixing input mechanism 140 in place with respect to housing 120.

Figure 4A:
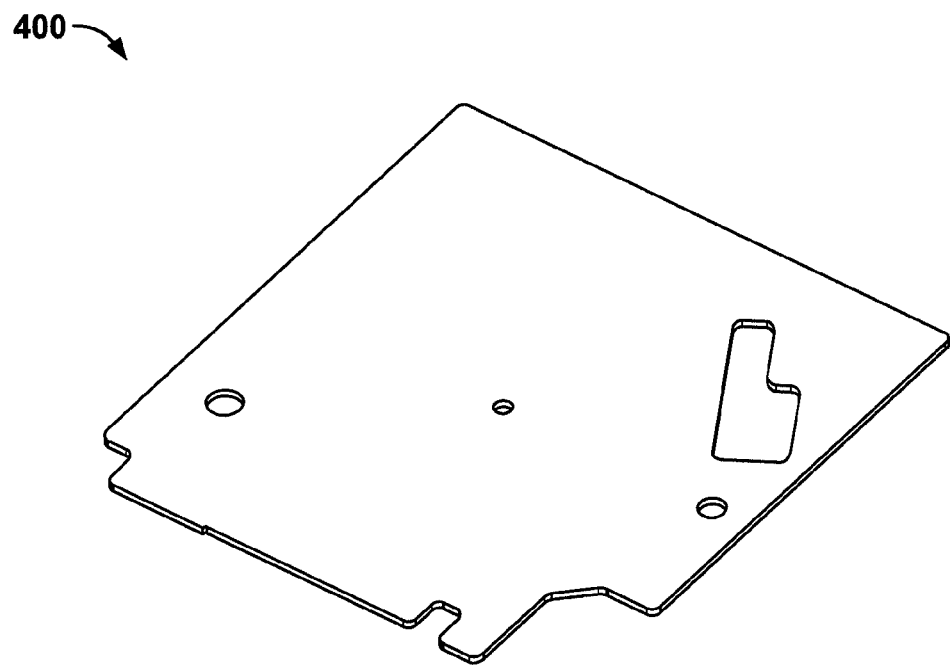
FIG. 4A is a top perspective view of a plate in accordance with some embodiments of the invention.

FIG. 4A is a top perspective view of gimbal plate 400 in accordance with some embodiments of the invention. Gimbal plate 400 may for example be used to support input mechanism 140 in place with respect to housing 120 of electronic device 100. Gimbal plate 400 may include any suitable material and may be positioned in any suitable location within housing 120. For example, gimbal plate 400 may be a steel plate that may be stamped or etched to a thickness of at least 0.4 millimeters, and may be positioned within housing 120 so as to be coupled to housing 120 at the portion of surface 240 that may be underneath surface 220a and that may be positioned underneath input mechanism 140. Gimbal plate 400 may be stamped or etched to a thickness of at least 0.4 millimeters to provide an adequate sensation of resistance to a user when the user depresses input mechanism 140. Gimbal plate 400 may include any other suitable features, such as springs (not shown) welded to gimbal plate 400 that may be used to ground gimbal plate 400 to frame 840 within housing 120 for user safety purposes. Frame 840 is described further below with respect to FIG. 8. Gimbal plate 400 also may include screws or connectors (not shown) to couple gimbal plate 400 to other components within housing 120, switches (not shown) to detect user inputs, and electrical connections or flex circuits (not shown) to create electrical connections between the switches and any suitable surface underneath gimbal plate 400 (e.g., a circuit board).

Figure 4B:
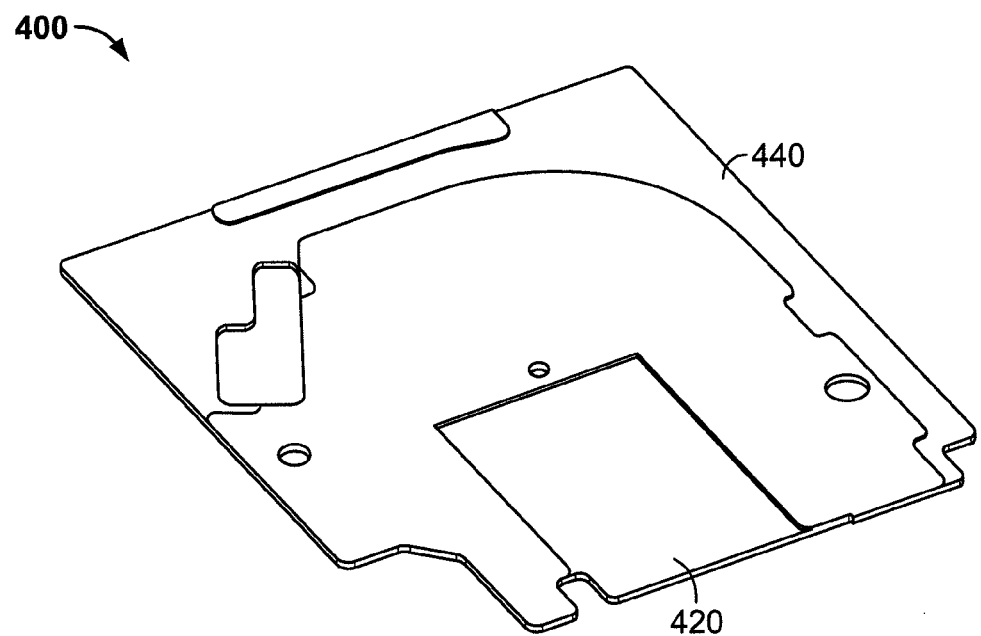
FIG. 4B is a bottom perspective view of the plate of FIG. 4A etched in accordance with some embodiments of the invention.

Gimbal plate 400 also may include any suitable number of depressions on its bottom face (e.g., the face that is directed toward surface 220b) to provide sufficient clearance for other components within the cavity of housing 120. FIG. 4B is a bottom perspective view of the gimbal plate of FIG. 4A etched in accordance with some embodiments of the invention. Depressions 420 and 440 may be created on the bottom face of gimbal plate 400 using any suitable approach. For example, depressions 420 and 440 may be chemically etched into gimbal plate 400. Alternatively, depressions 420 and 440 may be laser etched into gimbal plate 400. Depressions 420 and 440 may be of any suitable depth to permit the components for which depressions 420 and 440 are created to sufficiently clear gimbal plate 400. In some embodiments, a steel sheet may be stamped or etched to form gimbal plate 400 and then gimbal plate 400 may be etched to form depressions 420 and 440. In some embodiments, depressions 420 and 440 may be etched into the steel sheet and then the steel sheet may be etched or stamped to form gimbal plate 400 into an appropriate shape. Depressions 420 and 440 may be of any suitable depth, including for example, 0.1 millimeter deep.

Depressions 420 and 440 may be formed to provide clearance for any suitable components that may be critical to the proper functioning of electronic device 100. For example, depression 420 may be etched into gimbal plate 400 to provide clearance for a processing chip. Depression 440 may be etched into gimbal plate 400 to provide clearance for a flexible circuit ribbon that may be used to detect and transmit information related to an input entered on input mechanism 140.

Figure 5A:
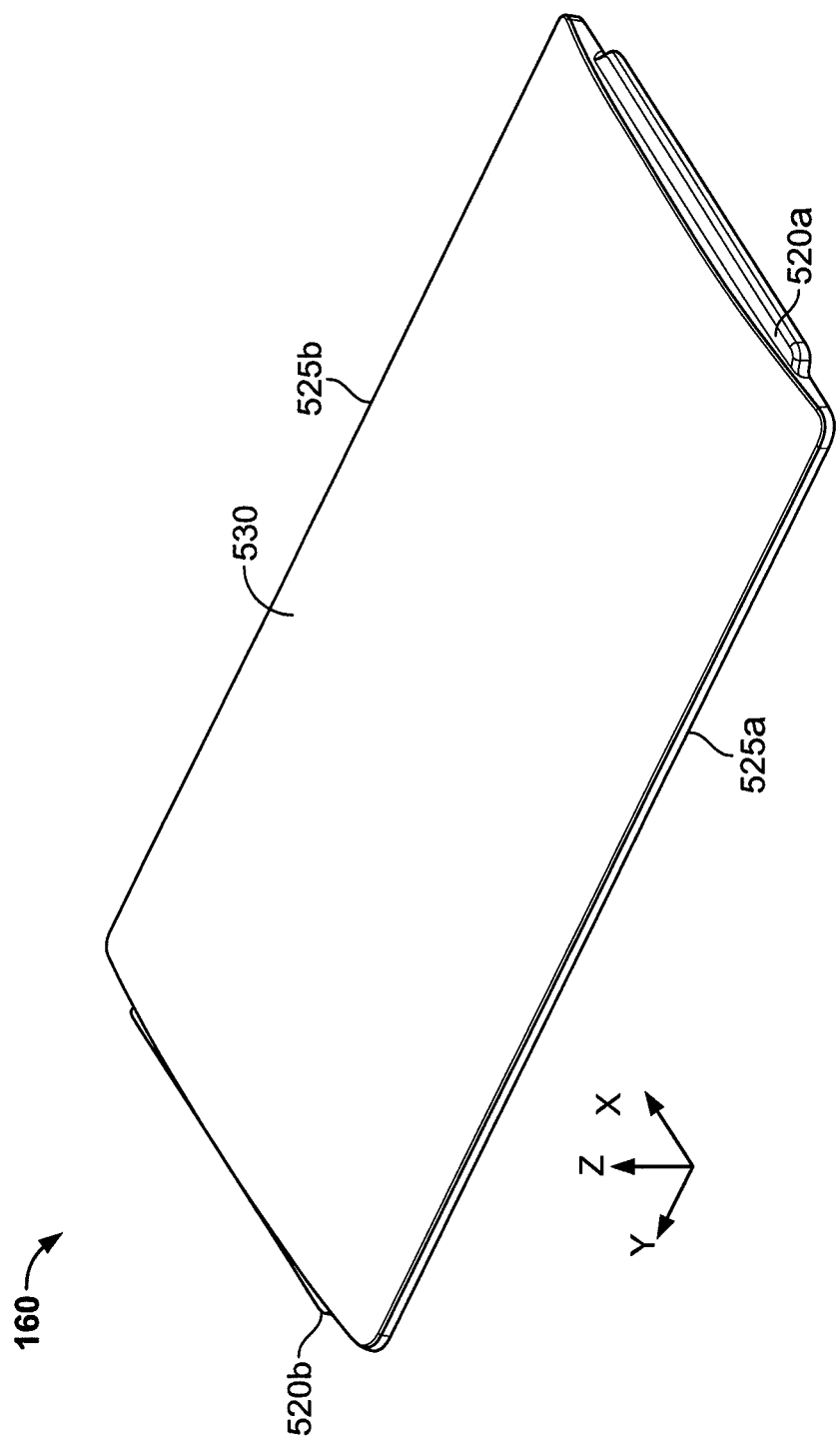
FIG. 5A is a bottom, front, left perspective view of a cover for an output mechanism in accordance with some embodiments of the invention.

FIG. 5A is a bottom, front, left perspective view of cover 160 in accordance with some embodiments of the invention. Cover 160 may include any suitable material for protecting an output mechanism (not shown), such as plastic, glass, a composite material, or any combination of materials. For example, cover 160 may be made of Asahi white glass, Corning gorilla glass 1317, or Corning gorilla glass 2317. Cover 160 may be made of glass to resist scratches and to improve the durability of electronic device 100. In addition, cover 160 may be made of glass to maintain the stiffness of cover 160 while reducing its thickness, thereby reducing the load on an output mechanism that may be positioned underneath cover 160 when electronic device 100 is assembled. The stiffness of cover 160 may also enable a thinner output mechanism to be used in electronic device 100.

Cover 160 may include any suitable dimensions. For example, cover 160 may be of any suitable length, including a length within the range of 43.56 millimeters to 43.62 millimeters. Cover 160 may also be of any suitable width, including a width within the range of 33.60 millimeters to 33.66 millimeters. Cover 160 also may include any suitable thickness that may vary along the X axis from edge 525a to 525b. For example, outer face 530 of cover 160 may include a spline or curvature so that cover 160, once assembled with housing 120, may correspond to the overall curvature of surface 220a and may provide a flush uniform surface with surface 220a. Cover 160 may be symmetrical about the Y axis in its thickness. At its maximum thickness, cover 160 may include any suitable thickness, including a thickness of 1.63 millimeters.

Cover 160 may include any suitable features. For example, cover 160 may include any suitable number of flanges 520 (e.g., flange 520a and flange 520b) that may secure cover 160 within an opening of housing 120 during the assembly of electronic device 100 and may provide a reference surface for positioning cover 160 with respect to housing 120. The assembly of electronic device 100, including cover 160, may be described further below with respect to FIG. 8.

Flanges 520a and 520b may include any suitable dimensions. For example, each of flanges 520a and 520b may be 25.86 millimeters long along the X axis, 0.72 millimeters wide along the Y axis, and have a thickness within the range of 0.62 millimeters to 0.68 millimeters. In some embodiments, each of flanges 520a and 520b may be formed on any suitable side of cover 160, may completely or partially extend across any suitable side, and may be incremental (e.g., each flange may include multiple flanges or any suitable side of cover 160 may include multiple flanges) or may be continuous (e.g., each flange may constitute a single flange). If a side includes multiple flanges, each of the flanges may include any suitable dimensions, including any suitable thicknesses and/or lengths.

In general, the configuration of flanges 520a and 520b may depend on the desired assembly of electronic device 100. In the illustrated embodiment, cover 160 may include a pair of flanges 520a and 520b that may be disposed on opposite sides of cover 160, including, for example, on the top and bottom edges of the cover 160, as shown. In some embodiments, if cover 160 includes a curved outer surface 530, the top and bottom edges of cover 160 may include more space between curved outer surface 530 and a bottom surface of the cover for one or more flanges. For example, in one embodiment, cover 160 may include a top surface 530 with a curve and a bottom flat surface (not shown). The curve may be a subtle curve that slopes smoothly and uniformly on each side from a high portion to a low portion (e.g., blade like). In some embodiments, the top surface may be curved in any suitable number of additional directions, including, for example, in two directions (e.g., in the direction of the X axis and in the direction of the Y axis of FIG. 5A).

Cover 160 may be manufactured in any suitable manner. In some embodiments, cover 160, including flanges 520a and 520b, may be machined from a single piece of glass using a computerized machining process such as computerized numerical control. During the machining process, a chamfer may be nailed into edges 525a and 525b to break cover 160 away from the single piece of glass. The machining process may generate the plan view of cover 160, but the surface of cover 160 may be rough and may not include the proper spline to correspond to the curvature of housing 120. The proper spline may be manufactured on outer surface 530 using any suitable method. For example, a spinning wheel may grind down outer surface 530 in a back and forth fashion until the spline of outer surface 530 corresponds to the curvature of housing 120.

Figure 5B:
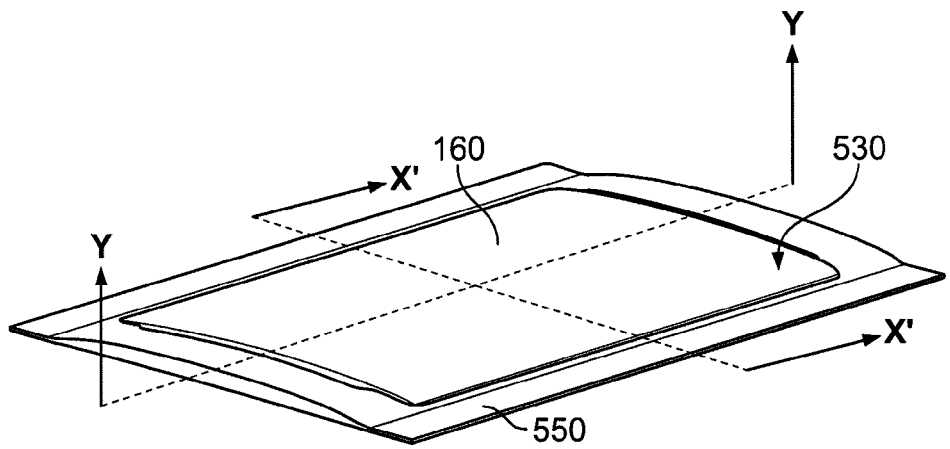
FIG. 5B is a bottom, front, right perspective view of the cover of FIG. 5A inserted into a lapping fixture in accordance with some embodiments of the invention.

The spinning wheel may generate the spline view of cover 160, but all surfaces of cover 160, including the chamfer along edges 525a and 525b, may be polished using any suitable method. FIG. 5B is a bottom, front, right perspective view of the cover 160 inserted into a lapping fixture in accordance with some embodiments of the invention. Lapping fixture 550 may be made of any suitable material (e.g., plastic). The top surface of lapping fixture 550 may include the same spline as outer surface 530 (FIG. 5A), but outer surface 530 may be offset beyond the spline profile of the lapping fixture by any suitable amount, such as 0.1 millimeters, to permit outer surface 530 and the edges of cover 160, including edges 525a and 525b (FIG. 5A), to be polished properly. Once inserted into lapping fixture 550, cover 160 may be polished using any suitable method, including for example by bristles being brushed in a back and forth fashion across outer surface 530 and across at least a portion of edges 525a and 525b. In some embodiments, the chamfer along edges 525a and 525b may be polished by the bristles until it includes a radius of 0.1 millimeters at an angle of 45 degrees relative to the Z axis.

Figure 5C:
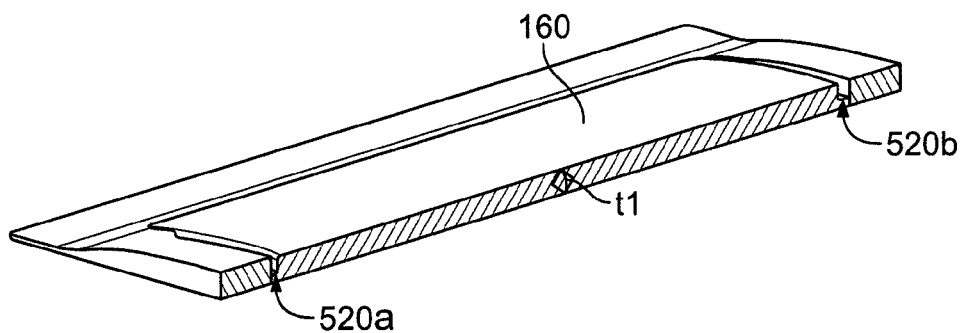
FIG. 5C is a bottom, front, right cross-sectional view of the cover of FIG. 5A, taken from line Y-Y of FIG. 5B, in accordance with some embodiments of the invention.

FIG. 5C is a bottom, front, right cross-sectional view of cover 160, taken from line Y-Y of FIG. 5B, in accordance with some embodiments of the invention. Lapping fixture 550 may be designed to accommodate flanges 520a and 520b. Along line Y-Y, cover 160 may not vary in thickness t1. In some embodiments, cover 160 may be 1.63 millimeters thick along line Y-Y. In some embodiments, cover 160 may be symmetrical in terms of shape and thickness about line Y-Y. Alternatively, in some embodiments, cover 160 may vary in thickness t1 along line Y-Y between flange 520a and flange 520b.

Figure 5D:
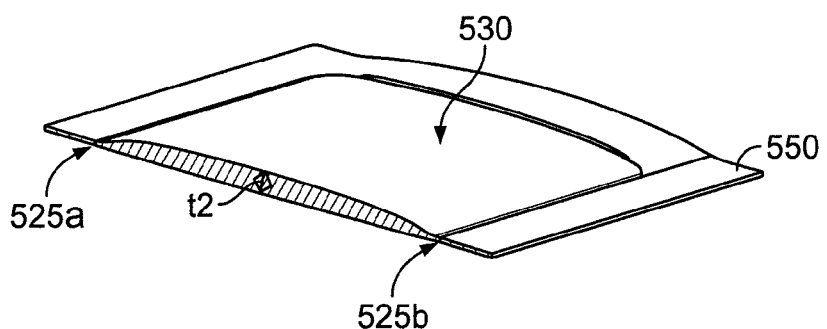
FIG. 5D is a bottom, front, right cross-sectional view of the cover of FIG. 5A, taken from line X'-X' of FIG. 5B, in accordance with some embodiments of the invention.

FIG. 5D is a bottom, front, right cross-sectional view of cover 160, taken from line X'-X' of FIG. 5B, in accordance with some embodiments of the invention. Along line X'-X', cover 160 may vary in thickness t2 between edge 525a and edge 525b because of the spline of outer surface 530 (FIG. 5A). For example, thickness t2 may increase from edge 525a (or from edge 525a) to a maximum thickness in the middle of cover 160 (e.g., a point on line Y-Y), and thickness t2 may decrease from the middle of cover 160 to edge 525b (or to edge 525a). In some embodiments, t2 may be any suitable thickness at edges 525a and 525b and t2 may increase to any suitable maximum thickness away from edges 525a and 525b, including, for example, a maximum thickness of 1.63 millimeters at a point in the middle of cover 160 (e.g., a point on line Y-Y).

Figure 6A:
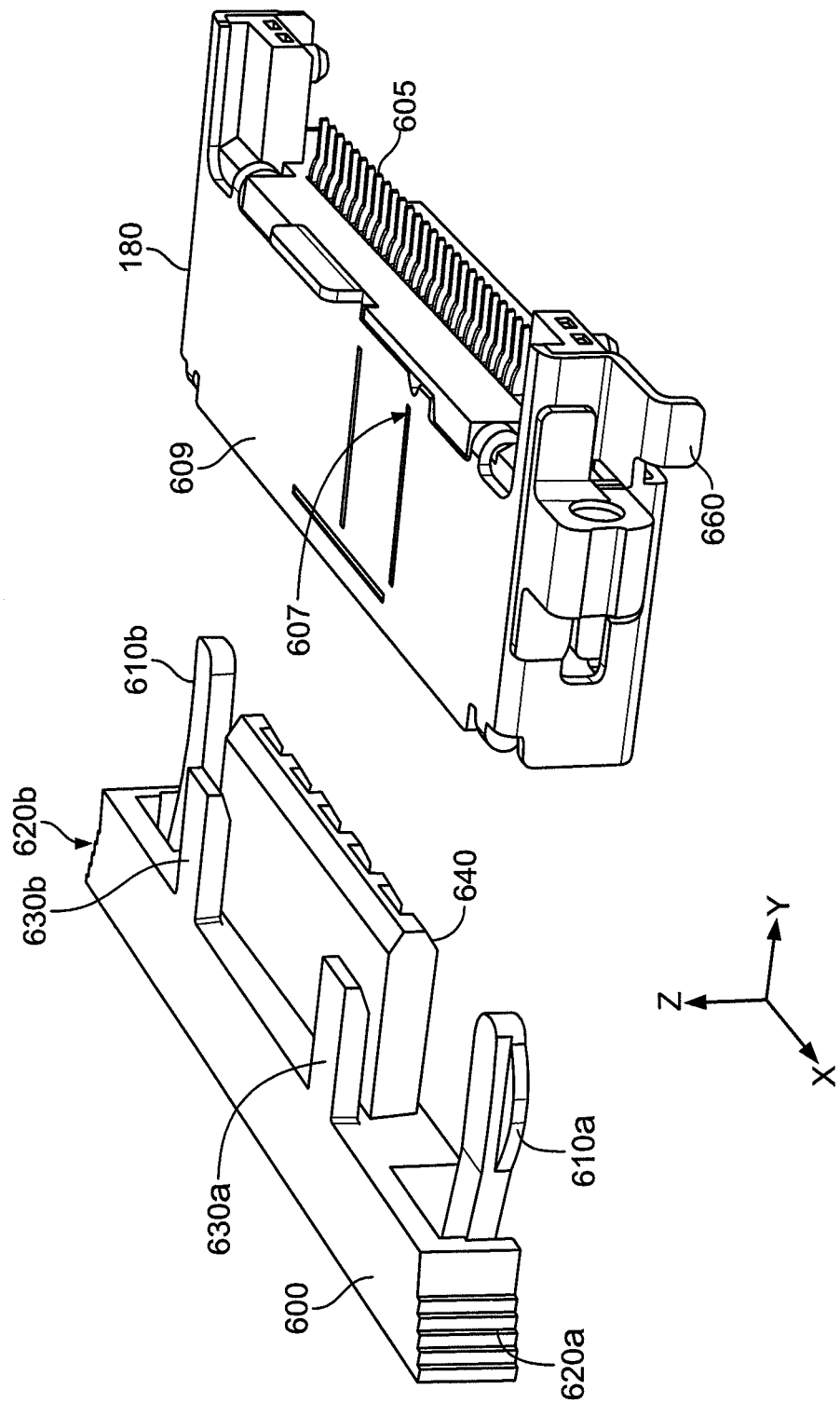
FIG. 6A is a top, front, right perspective view of a connector of the electronic device of FIG. 1 and a fixture in accordance with some embodiments of the invention.

FIG. 6A is a top, front, right perspective view of connector 180 and a fixture 600 in accordance with some embodiments of the invention. Connector 180 may include any suitable means, including for example a 30-pin connector, for establishing and maintaining an electrical connection between electronic device 100 and any other suitable component. For example, connector 180 may include male elements 605 (e.g., thirty elements) that may each connect to any suitable surface within electronic device 100, including for example a circuit board, to create an electrical connection. Connector 180 also may include a female element (not shown) that may be visible to a user of electronic device 100 and that may be used to connect electronic device 100 to any suitable device (e.g., a dock) or other component.

Connector 180 may be mounted to any suitable surface, including for example a circuit board, using any suitable approach. For example, connector 180 may be attached to a circuit panel 650 (FIG. 6C) using surface mount technology to mount hook 660 and male elements 605 to circuit panel 650. Connector 180 may include any suitable number of hooks 660 (e.g., two hooks), although only one is shown in FIG. 6A. Connector 180 may also include a center of gravity that may exist in any suitable location given the distribution of the mass of connector 180. For example, center of gravity 607 may be located behind male elements 605 and approximately in the middle of connector 180 along the X axis. Because the center of gravity 607 may be distant from the point at which connector 180 is mounted to circuit panel 650 (e.g., at hooks 660 and male elements 605), connector 180 may have a tendency to pull downward away from circuit panel 650, or to rotate about the X axis passing through center of gravity 607, and may create an upward force in the Z direction on hooks 660 and male elements 605. This tendency of connector 180 to rotate may interfere with the positioning of connector 180 within housing 120 and may also present a negative impression of the assembly of electronic device 100 to a user of electronic device 100. To ameliorate the tendency of connector 180 to rotate away from circuit panel 650 during the mounting of hooks 660 to circuit panel 650, a fixture 600 may be coupled to connector 180 to provide rigid support in the Z direction while connector 180 may be coupled (e.g., soldered using surface mount technology) to circuit panel 650.

Fixture 600 may include any suitable material, including for example, plastic, ceramic, metal, a composite, or any combination of materials. Fixture 600 may include tongues 630a and 630b that may slide along the top surface 609 of connector 180 to align fixture 600 as it is coupled to connector 180. Similarly, fixture 600 may include insert 640, with any suitable number of grooves that may be inserted into connector 180 to support connector 180 during its attachment to circuit panel 650. Fixture 600 also may include any suitable number of legs that may be inserted into connector 180 and that may extend to hooks 660. For example, fixture 600 may include legs 610a and 610b. In some embodiments, legs 610a and 610b may span a distance wider than the distance allotted for their insertion into connector 180. By depressing and holding tabs 620a and 620b, legs 610a and 610b may be forced closer together so that they may be inserted into connector 180. Once legs 610a and 610b are inserted, tabs 620a and 620b may be released, which may also release the force on legs 610a and 610b, causing legs 610a and 610b to provide resistance against the sidewalls of connector 180. The resistance may ensure that fixture 600 remains coupled to connector 180.

Figure 6B:
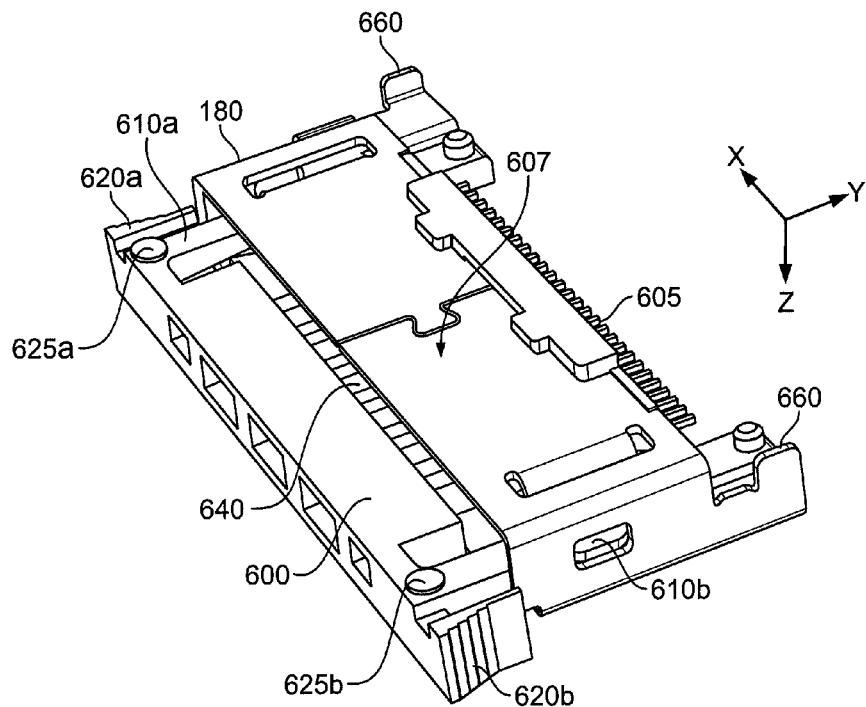
FIG. 6B is a bottom, back, left perspective view of the fixture of FIG. 6A coupled to the connector of FIG. 6A in accordance with some embodiments of the invention.

FIG. 6B is a bottom, back, left perspective view of fixture 600 coupled to connector 180 in accordance with some embodiments of the invention. Insert 640 may be inserted into connector 180 and may be aligned in the Z direction with respect to connector 180 using tongues 630a and 630b (not shown). Using tabs 620a and 620b, legs 610a and 610b may have been inserted into connector 180 and may be pressing against the sidewalls of connector 180 to support the coupling of fixture 600 to connector 180. To remove fixture 600 from connector 180, tabs 620a and 620b may be depressed toward one another, causing legs 610a and 610b to be forced toward one another, and allowing fixture 600 to be slid away from connector 180. In some embodiments, fixture 600 may be extracted from connector 180 by applying at least a 300 gram-force.

Figure 6D:
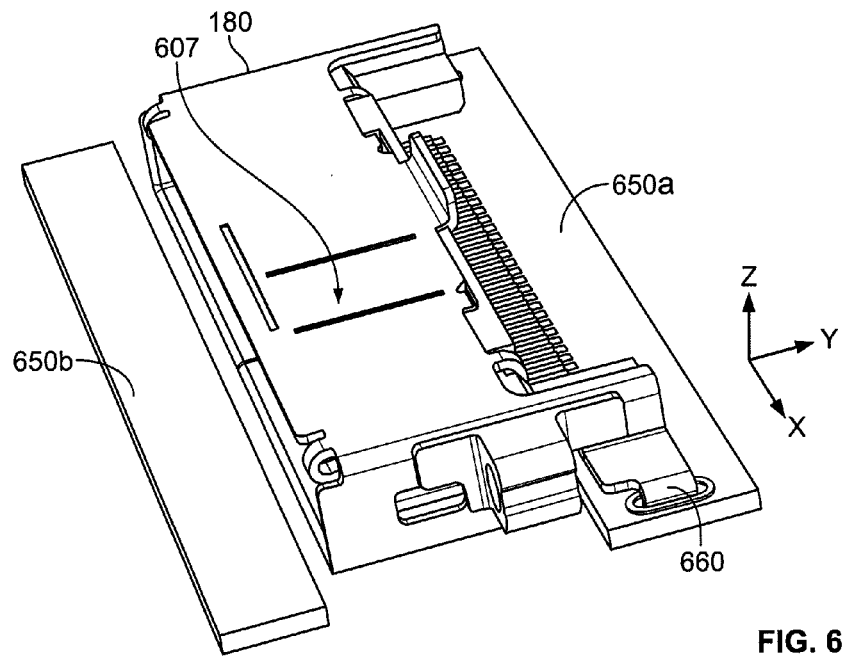
FIG. 6D is a top, back, right perspective view of a portion of the surface of FIG. 6C separated from the connector in accordance with some embodiments of the invention.
Figure 6C:
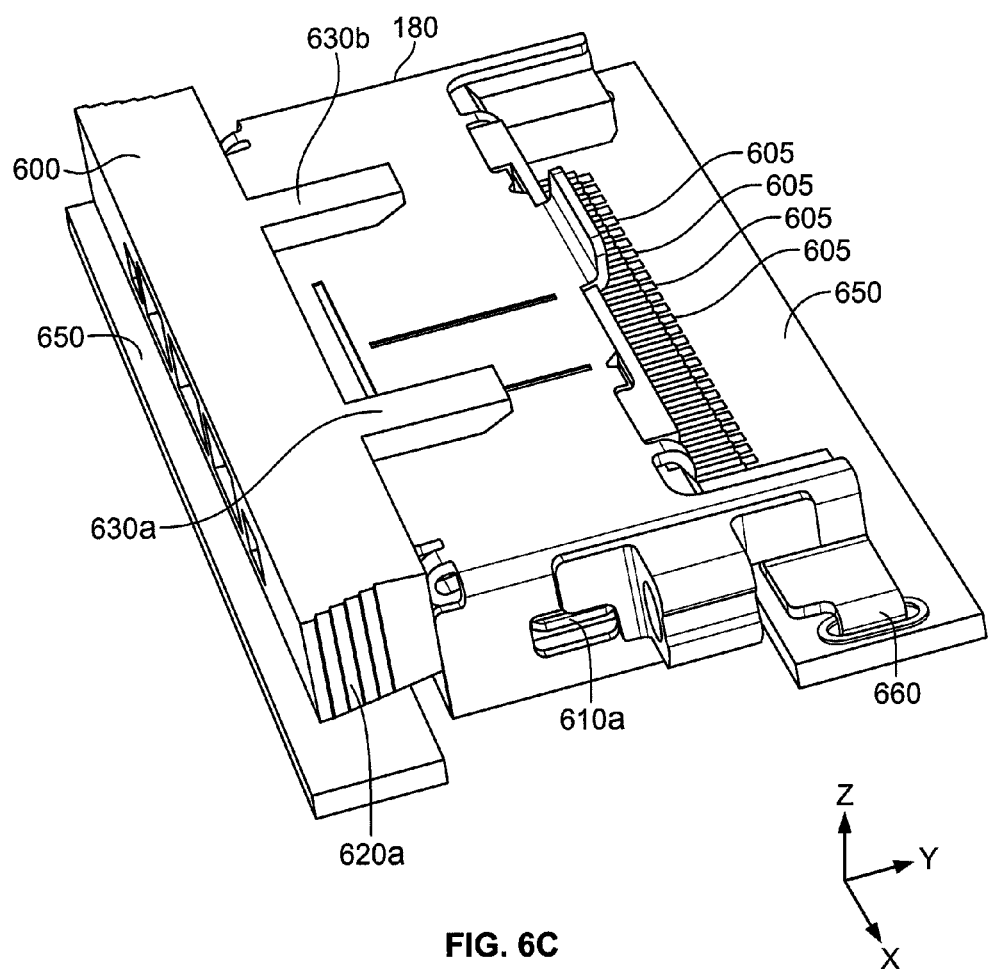
FIG. 6C is a top, back, right perspective view of the fixture and connector of FIG. 6B attached to a surface in accordance with some embodiments of the invention.

After fixture 600 has been coupled to connector 180, connector 180 may be attached to circuit panel 650 using any suitable approach. FIG. 6C is a top, back, right perspective view of fixture 600 coupled to connector 180 which is in turn attached to circuit panel 650 in accordance with some embodiments of the invention. Connector 180 may be attached to circuit panel 650 using any suitable approach. For example, connector 180 may be mounted at hooks 660 to circuit panel 650 using surface mount technology to create a mechanical connection between connector 180 and circuit panel 650. Each of male elements 605 may also be mounted to circuit panel 650 using surface mount technology to establish an electrical connection between connector 180 and circuit panel 650. Fixture 600 may be aligned vertically with respect to connector 180 using tongues 630a and 630b. Fixture 600 may provide rigid support to connector 180 in the Z direction while connector 180 is being mounted to circuit panel 650. In turn, circuit panel 650 may extend underneath and beyond fixture 600 during the mounting process. In some embodiments, fixture 600 may rest on circuit panel 650 using feet 625a and 625b.

Once hooks 660 and male elements 605 have been mounted to circuit panel 650, fixture 600 may be separated from connector 180 and connector 180 may be separated from the unused portion of circuit panel 650 using any suitable approach. FIG. 6D is a top, back, right perspective view of at least a portion of circuit panel 650 separated from connector 180 in accordance with some embodiments of the invention. Connector 180 may be mounted to circuit panel portion 650a using surface mount technology, but circuit panel portion 650a may form part of a larger circuit panel 650, including circuit panel portion 650b. Circuit panel portion 650b may be separated from circuit panel 650 prior to the assembly of connector 180 with electronic device 100. Any suitable technique may be used to separate circuit panel portion 650a from circuit panel portion 650b. For example, surface mount technology may also be used to separate portion 650a from the other portions of circuit panel 650, including portion 650b, once connector 180 has been mounted to circuit panel portion 650a. In some embodiments, fixture 600 may be separated from connector 180 after circuit panel portion 650a has been separated from circuit panel portion 650b.

Figure 6E:
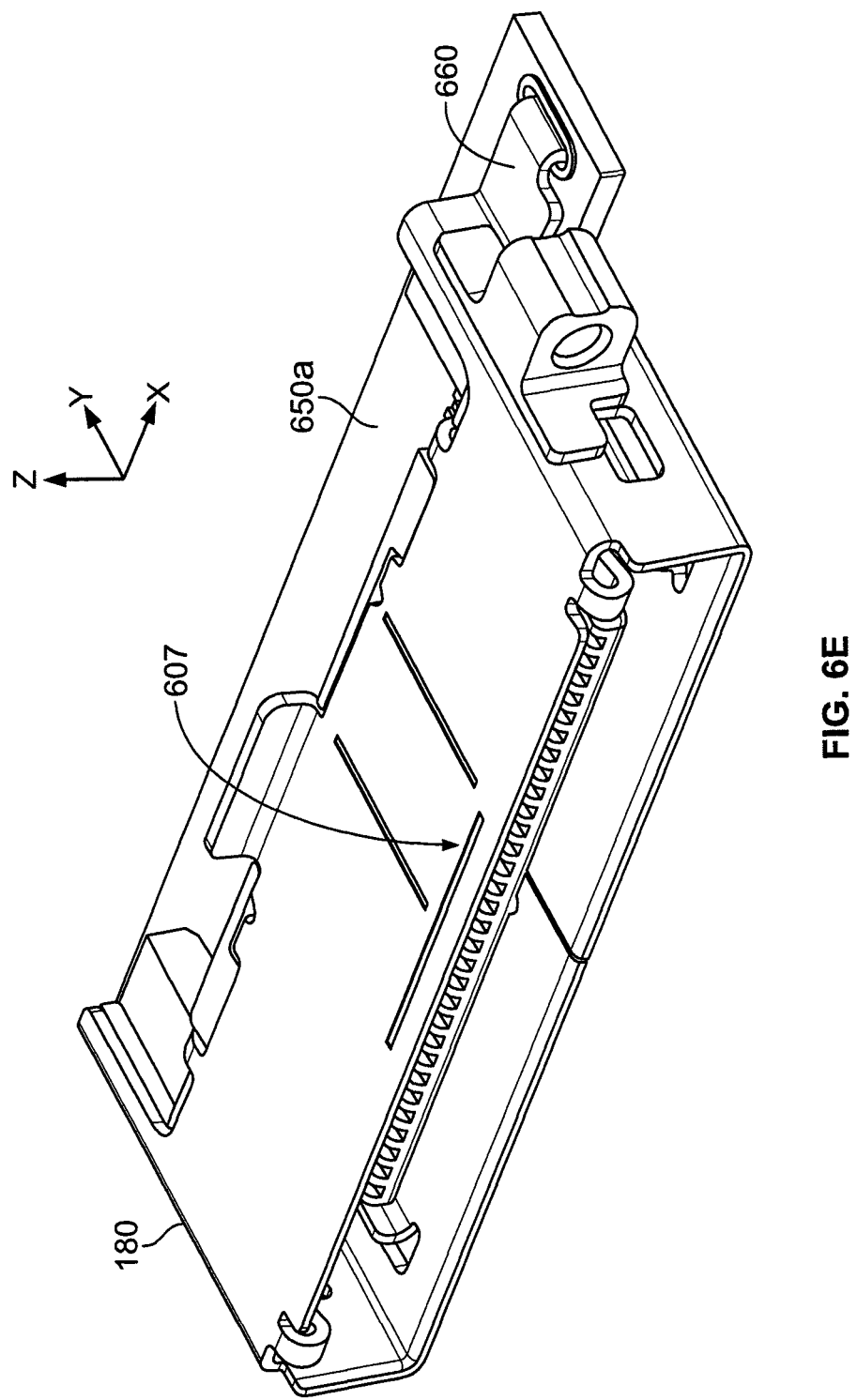
FIG. 6E is a top, back, right perspective view of the connector of FIGS. 6A-6D prepared for assembly in accordance with some embodiments of the invention.

Once connector 180 has been mounted to circuit panel portion 650a, connector 180 may be sufficiently supported to avoid rotating about the X axis passing through center of gravity 607. FIG. 6E is a top, back, right perspective view of connector 180 prepared for assembly in electronic device 100 in accordance with some embodiments of the invention. Connector 180 may be mechanically connected to circuit panel portion 650a at hooks 660. Connector 180 may also be electrically connected to circuit panel portion 650a at each of male elements 605 (not shown). After fixture 600 has been removed and circuit panel portion 650a has been separated from circuit panel portion 650b, connector 180 may be ready for assembly as part of electronic device 100. In some embodiments, housing 120 may be used to provide additional support to connector 180 during the assembly of electronic device 100 to prevent connector 180 from rotating away from circuit panel portion 650a.

Figure 7:
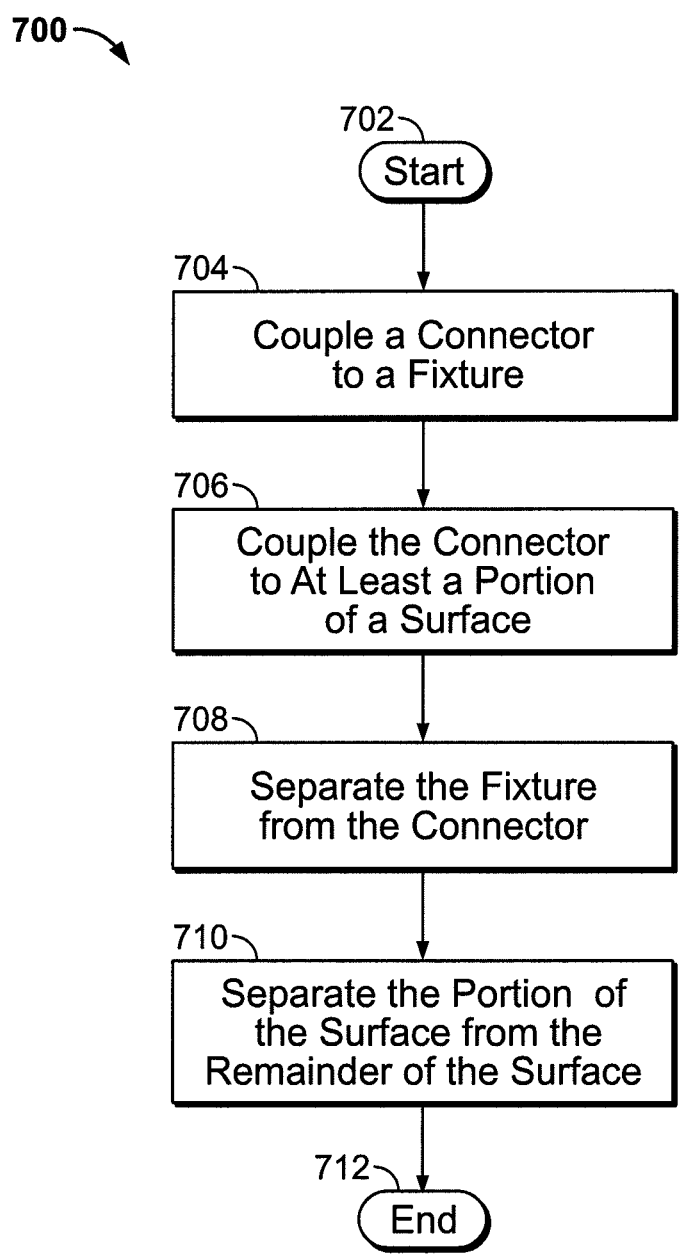
FIG. 7 is a flowchart of an illustrative process for mounting a connector to a surface in accordance with some embodiments of the invention.

FIG. 7 is a flowchart of an illustrative process for mounting connector 180 to circuit panel portion 650a in accordance with some embodiments of the invention. Process 700 may begin at step 702. At step 704, a connector may be coupled to a fixture using any suitable approach. For example, connector 180 may be coupled to fixture 600 by inserting insert 640 and legs 610a and 610b into connector 180 as described above with respect to FIGS. 6A, 6B, and 6C.

Process 700 may advance to step 706, where the connector, to which the fixture is coupled, may be coupled to at least a portion of any suitable surface using any suitable approach. For example, connector 180 may be mechanically connected via hooks 660 to circuit panel portion 650a using surface mount technology. Connector 180 may also be electrically connected via male elements 605 to circuit panel portion 650a using surface mount technology. In some embodiments, fixture 600 may not be connected to, but may be in contact with, at least another portion of circuit panel 650 (e.g., circuit panel portion 650b).

Process 700 may advance to step 708, where the fixture may be separated from the connector in any suitable manner after the connector has been attached to a portion of the surface. For example, after connector 180 has been mounted on circuit panel portion 650a, fixture 600 may be separated from connector 180 by depressing tabs 620a and 620b to slide legs 610a and 610b out of connector 180.

Process 700 may then advance to step 710, where a portion of the surface to which connector 180 may be coupled may be separated from the remainder of the surface using any suitable approach. For example, circuit panel portion 650a may be separated from circuit panel portion 650b and any other portion of circuit panel 650 using surface mount technology. In some embodiments (not shown), fixture 600 may be separated from connector 180 after circuit panel portion 650a has been separated from circuit panel portion 650b. Process 700 may then advance to step 712 and end.

Once housing 120, input mechanism 140, and cover 160 have been manufactured, and connector 180 has been mounted to circuit panel portion 650a, electronic device 100 may be assembled using any suitable approach.

FIG. 8 is an exploded bottom, front, right perspective view of an assembly of electronic device 100 in accordance with some embodiments of the invention. Electronic device 100 may include any suitable number of assemblies that may be connected to assemble electronic device 100. For example, input mechanism 140 may be assembled using wheel 320, button 340, and pad 360 before input mechanism 140 may be inserted into housing 120 and coupled to gimbal plate 400 (FIG. 4). Electronic device 100 may also include any other suitable electronic assemblies, such as a first electronic assembly 805 and a second electronic assembly 807.

First assembly 805 may include any suitable components to provide power, input/output processing, and the ability to connect to other devices (e.g., a charging dock, headphones) to electronic device 100. For example, first assembly 805 may include battery 810 that may be coupled to frame 840 and may be used to power electronic device 100. Frame 840 may include any suitable material, including for example, sheet metal. Frame 840 may be used to couple battery 810 to circuit panel portion 650a (FIG. 6E), to which connector 180 may also be mounted. In some embodiments, frame 840 may be used to ground circuit panel portion 650a to housing 120 for user safety purposes.

Circuit panel portion 650a may be operative to control the operations and performance of electronic device 100. Circuitry panel portion 650a may include, for example, a processor, a bus (e.g., for sending instructions to the other components of electronic device 100), memory, logic circuitry, storage, or any other suitable component for controlling the operations of electronic device 100. In some embodiments, a processor may drive output mechanism 830 and process inputs received from input mechanism 140. The memory and storage may include, for example, a hard-drive, cache, Flash, ROM, and/or RAM, any other suitable type of storage component, or any combination thereof. The memory may be of any suitable size, including, for example, 8, 12, 16, 32, 64, or 128 gigabytes. In some embodiments, the memory may include cache memory, which may include one or more different types of memory used for temporarily storing data for electronic device applications. The memory may store media data (e.g., music, image, and video files), software (e.g., for implementing functions on electronic device 100), or the memory may be specifically dedicated to storing firmware (e.g., for device applications such as an operating system, user interface functions, and processor functions). In some embodiments, the memory may be operative to store a media item that electronic device 100 may download from a host system. Alternatively, circuitry panel portion 650a may stream the media item from a source to make the media item available for playback without storing the media item in the memory.

Outputs may be transmitted from circuit panel portion 650a to output mechanism 830 using any suitable means, including for example flex circuit 865. Flex circuit 865 may be of any suitable length, including for example 25 millimeters, to permit connection with ZIF connector 867 of second assembly 807. In some embodiments, flex circuit 865 may resemble a flexible ribbon, and when the assembly of electronic device 100 is complete, may be folded to include a service loop that may resemble an S-shaped curve.

In some embodiments, jack 170 (e.g., an audio jack for inserting headphones) may also be coupled to circuit panel portion 650a and/or connector 180 as part of first assembly 805 and may be inserted into housing 120 along with first assembly 805. For example, jack 170 may be coupled to circuit panel portion 650a (e.g., using a flex circuit) and may be coupled to connector 180 using a screw 1150b, as described further below with respect to FIG. 11. Alternatively, in some embodiments, jack 170 may be coupled to circuit panel portion 650a and connector 180 and inserted into housing 120 after first assembly 805 has already been inserted into housing 120. Alternatively, jack 170 may be coupled to circuit panel portion 650a and connector 180 before first assembly 805 may be inserted into housing 120, and then jack 170 may be inserted into housing 120 after first assembly 805 has been inserted into housing 120.

Second assembly 807 may include any suitable components to interface with first assembly 805 and to present output to electronic device 100. Second assembly 807 may include output mechanism 830, which may include any suitable means for presenting information (e.g., textual, graphical, audible, and/or tactile information) to a user of electronic device 100. Output mechanism 830 may take various forms, including but not limited to audio speakers, headphones, audio line-outs, visual displays, antennas, infrared ports, rumblers, vibrators, or combinations thereof.

In some embodiments, output mechanism 830 may include any suitable screen or projection system for providing a display visible to the user. For example, output mechanism 830 may include a screen (e.g., a liquid crystal display). Output mechanism 830 may be operative to display content (e.g., information regarding a selected media file) under the direction of circuit panel portion 650a. In some embodiments, input mechanism 140 and output mechanism 830 may be a single input/output component, such as a touch screen, that may receive input information through a user's touch of a display screen and that may also provide visual information to a user via that same display screen.

Second assembly 807 may also include any suitable means for interfacing with first assembly 805 to receive output information from circuit panel portion 650a. For example, second assembly 807 may include ZIF connector 867 that may be coupled to flex circuit 865 during assembly of electronic device 100. Second assembly 807 may also include any other suitable components to provide sufficient power and support to, and control of, output mechanism 830, such as additional logic circuitry, foam cushioning, and any other suitable component.

Electronic device 100 may be assembled in any suitable manner. For example, gimbal plate 400 may be coupled to housing 120 by being adhered to surface 240 underneath the top of housing 120, and input mechanism 140 may thereafter be coupled to housing 120 and gimbal plate 400. In some embodiments, gimbal plate 400 may be adhered to surface 240 after input mechanism 140 is first coupled to housing 120.

In some embodiments, housing 120 may be too narrow in the Z direction to permit second assembly 807 to be inserted into housing 120 through opening 850a without output mechanism 830 coming into contact with gimbal plate 400. Similarly, housing 120 may be too narrow in the Z direction to permit first assembly 805 to be inserted into housing 120 through opening 850b without connector 180 coming into contact with gimbal plate 400. As a result, electronic device 100 may be assembled by inserting first assembly 805 through opening 850a, inserting second assembly 807 through opening 850b, and connecting first assembly 805 to second assembly 807 through opening 860.

For example, first assembly 805 may be slid into housing 120 through opening 850a until all of first assembly 805 may be positioned within housing 120 (e.g., the ends of connector 180 and jack 170 furthest from frame 840 may be positioned just inside opening 850a). Flex circuit 865 may at least partially emerge from opening 860, into which cover 160 may be finally positioned. Second assembly 807 may be at least partially inserted, but not completely inserted, into housing 120 through opening 850b. Second assembly 807 may be inserted far enough into housing 120 to permit ZIF connector 867 to be connected to flex circuit 865 through opening 860.

After first assembly 805 is connected to second assembly 807, cover 160 may be inserted into housing 120 using any suitable method. For example, cover 160 may be inserted at any suitable angle into the bottom end of opening 860 (e.g., the end closest to opening 850a) such that flange 520a (FIG. 5A) and at least a portion of cover 160 may be lowered into the cavity of housing 120. As a portion of cover 160 is being inserted into the cavity of housing 120, cover 160 may be positioned over the connection of flex circuit 865 to ZIF connector 867, such that neither flex circuit 865 nor ZIF connector 867 may emerge from opening 860.

After flange 520a and at least a portion of cover 160 are inserted into housing 120 through the bottom end of opening 860, the remaining portion of cover 160 may be lowered into opening 860 and cover 160 may be slid toward opening 850b. Flange 520a and flange 520b (not shown) may secure cover 160 in opening 860 by providing a reference for positioning cover 160 relative to housing 120. Flanges 520a and 520b may include dimensions such that after one flange (e.g., flange 520a) is inserted into opening 860, cover 160 may be pushed toward opening 850a and there may be enough space only for the second flange (e.g., flange 520b) to be rotated into opening 860. After flange 520b is inserted behind opening 860, cover 160 may be slid towards opening 850b so that both flange 520a and flange 520b may be seated within housing 120, thereby retaining cover 160 within opening 860. The top of each of flange 520a and 520b (e.g., the face of flange 520a and 520b that may contact housing 120) may provide a reference surface for properly aligning outer surface 530 of cover 160 with outer surface 220a of housing 120.

Once cover 160 is fixed within housing 120, the portion of second assembly 807 that remains outside of housing 120 may be inserted into housing 120 through opening 850b until all of second assembly 807 may be positioned within housing 120 and output mechanism 830 may be positioned underneath cover 160. As second assembly 807 is slid into housing 120, flex circuit 865 may bend into a service loop resembling an S-shaped curve in response to the movement of ZIF connector 867 toward circuit panel portion 650a.

Figure 9:
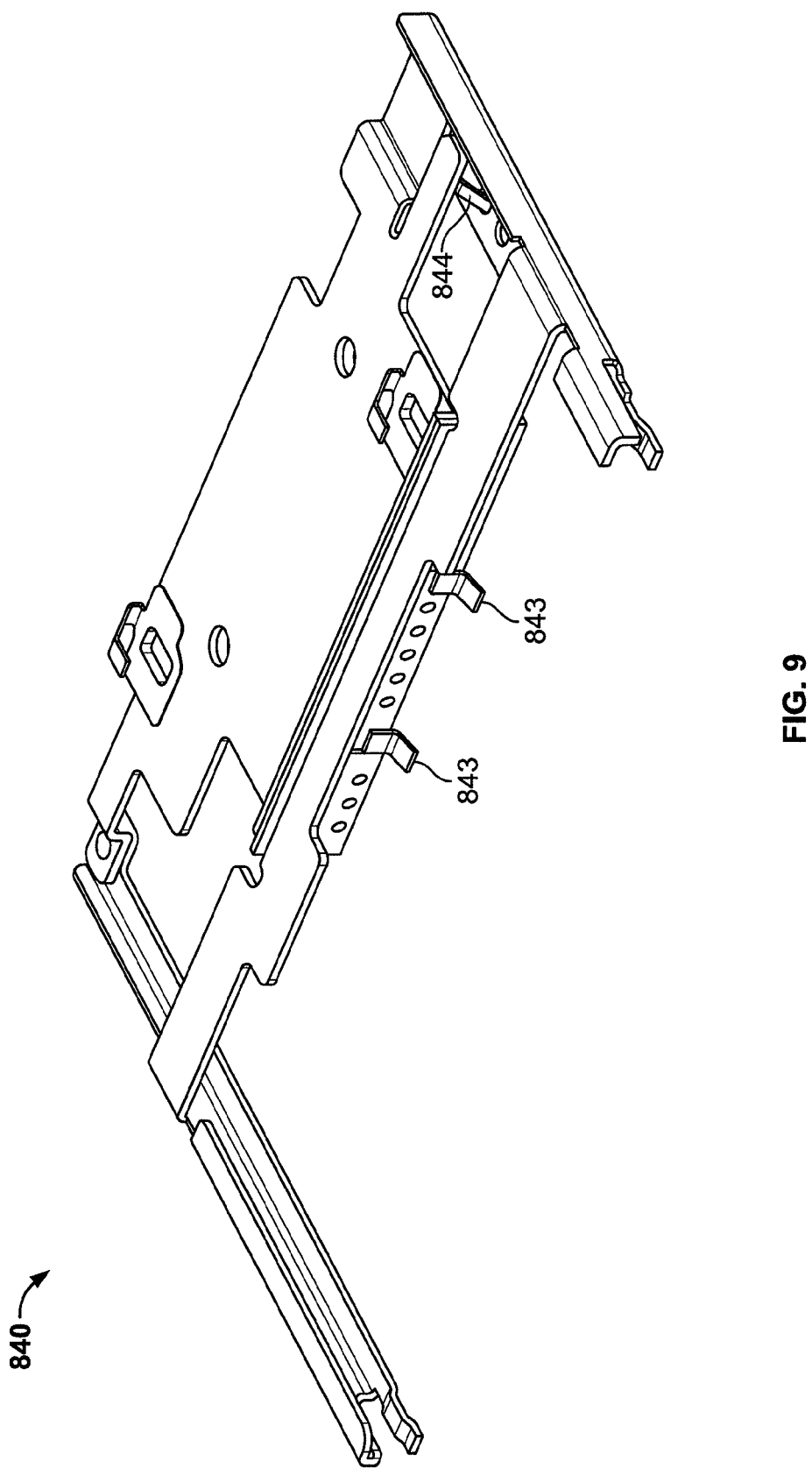
FIG. 9 is a bottom, front, right perspective view of a frame of the assembly of FIG. 8 in accordance with some embodiments of the invention.

FIG. 9 is a bottom, front, right perspective view of frame 840 in accordance with some embodiments of the invention. Frame 840 may be used to couple circuit panel portion 650a to battery 810, connector 180, and jack 170. Flex circuit 865 also may be coupled to frame 840. For user safety purposes, frame 840 may be grounded to housing 120 and may serve to ground any other suitable component that may be coupled to frame 840. For example, housing 120 may be manufactured from anodized aluminum, but at the point or points where frame 840 may contact housing 120 (e.g., at surface 240 closest to surface 220b), housing 120 may be laser etched to remove the anodized layer and to expose pads of bare aluminum on surface 240. Frame 840 may include any suitable mechanism to contact surface 240, including for example spring fingers 843. As frame 840 is inserted into housing 120 during the assembly of electronic device 100, spring fingers 843 may contact the pads of bare aluminum of surface 240 and frame 840 may be grounded to housing 120.

Similarly, frame 840 may ground circuit panel portion 650a to housing 120. Frame 840 may include any suitable mechanism to form an electrical contact with circuit panel portion 650a, including for example, tab 844, which may include any suitable material (e.g., gold). When first assembly 805 is assembled, circuit panel portion 650a may contact frame 840 at tab 844. When frame 840 is inserted into housing 120 and is grounded via spring fingers 843, circuit panel portion 650a may also be grounded to housing 120 via its connection with frame 840 at tab 844.

Figure 10:
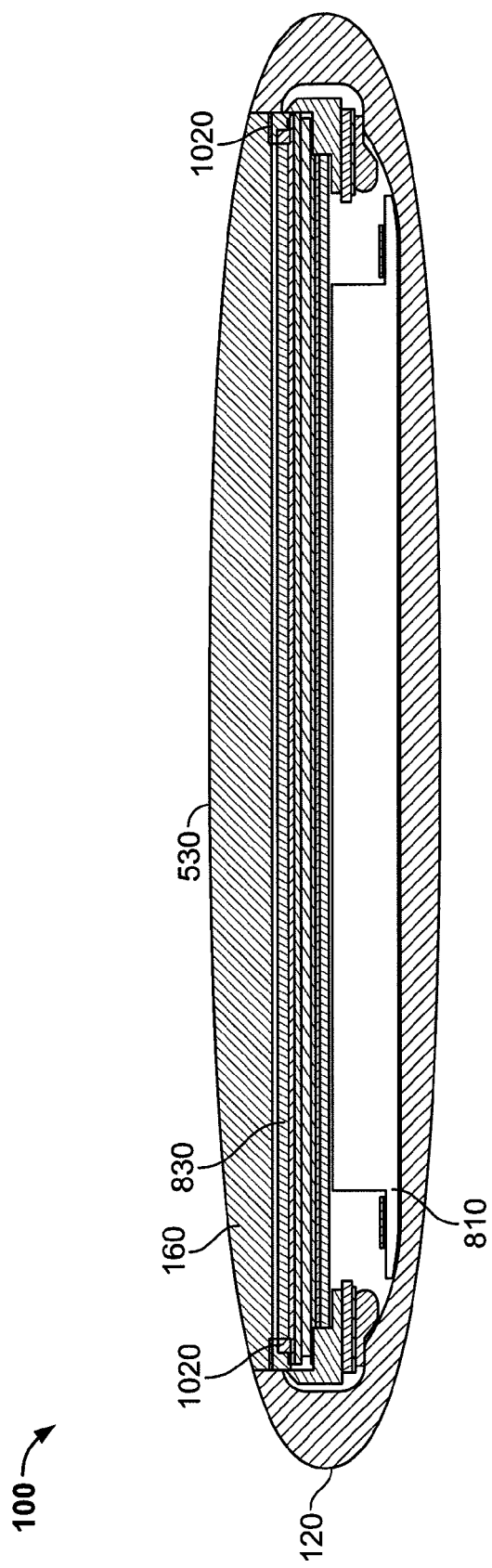
FIG. 10 is a cross-sectional view of the electronic device of FIG. 1, taken from line X-X of FIG. 1, in accordance with some embodiments of the invention.

FIG. 10 is a cross-sectional view of electronic device 100 taken from line X-X (FIG. 1) in accordance with some embodiments of the invention. The cross-sectional view may be taken from the perspective of looking through opening 850b into housing 120. The components of electronic device 100 may be positioned in any suitable manner within housing 120. For example, battery 810 may be positioned beneath all of the components of second assembly 807. Battery 810 may include a bottom surface that may substantially conform to the inner curved surface of the cavity of housing 120 (e.g., the channel formed between notches 280b and 280d in FIG. 2). Output mechanism 830 may be positioned directly beneath cover 160. Second assembly 807 may be positioned within the channels (e.g., may be slid in along the channels) formed between notches 280a and 280b (FIG. 2) on one side of housing 120 and notches 280c and 280d (FIG. 2) on another side of housing 120. Second assembly 807 also may be positioned with reference to the channel formed between notches 280b and 280d. These channels may help properly position second assembly 807 within the cavity relative to openings 850a and 850b of housing 120. Any suitable material may be used to protect output mechanism 830 from an impact to cover 160. For example, foam 1020 may be applied at the edges of output mechanism 830 to separate output mechanism 830 from contacting cover 160. Cover 160 may at least partially emerge through housing 120 and outer surface 530 may include the same degree of curvature as the surface of housing 120. In some embodiments, opening 860 may include any suitable mechanism, including, for example, flanges or grooves on an internal surface of housing 120 to support edges 525a and 525b of cover 160.

Figure 11:
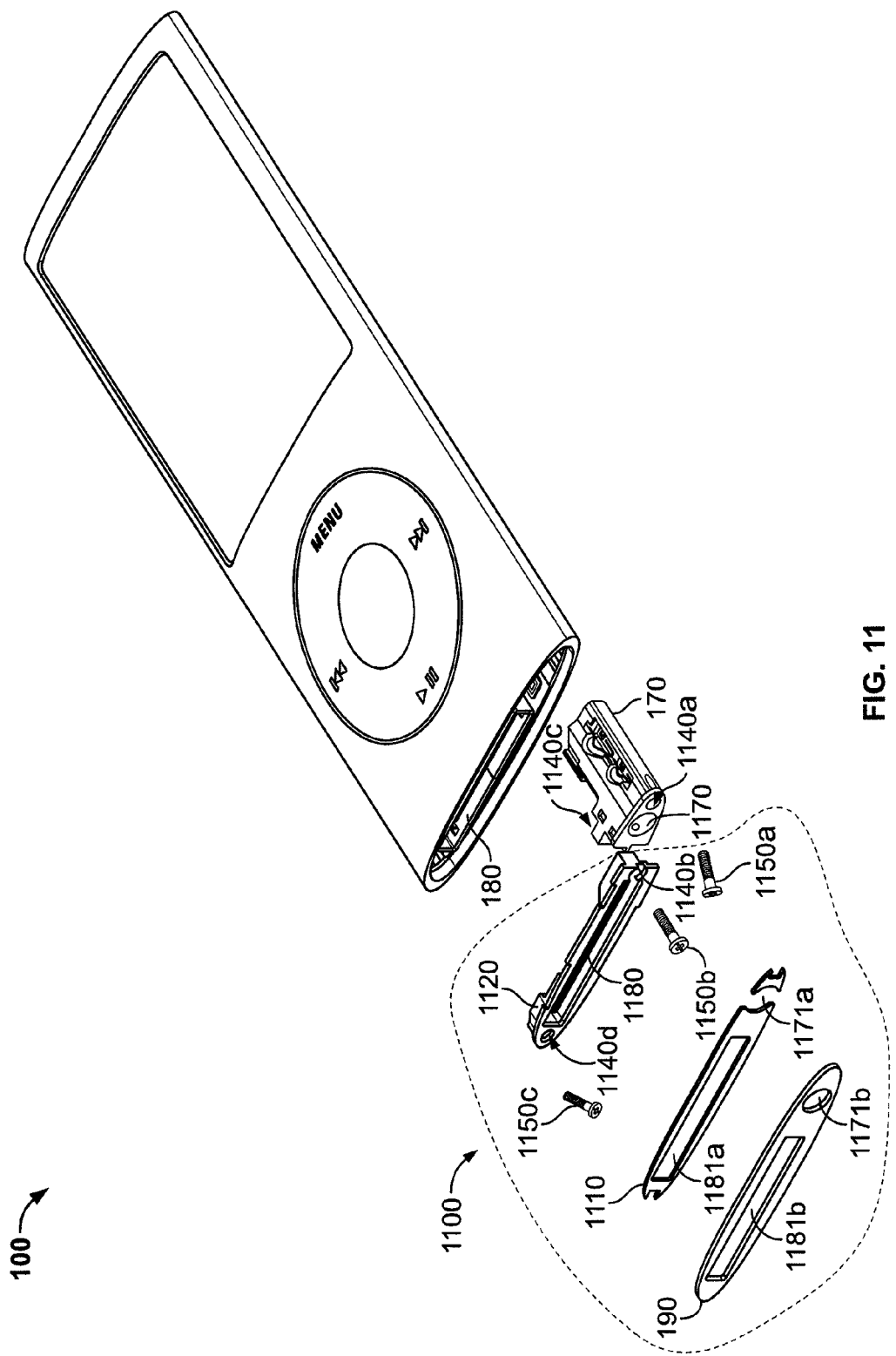
FIG. 11 is an exploded bottom, front, right perspective view of an end cap assembly of the electronic device of FIG. 1 in accordance with some embodiments of the invention.

Once first assembly 805, second assembly 807, input mechanism 140, and cover 160 have been inserted into housing 120, end cap assemblies or any other suitable mechanisms may be inserted into housing 120 to protect the assembled components. FIG. 11 is an exploded bottom, front, right perspective view of an end cap assembly 1100 of electronic device 100 in accordance with some embodiments of the invention. End cap assembly 1100 may include any suitable components, including for example, end cap 1120 with holes 1140b and 1140d and opening 1180, screws 1150a, 1150b, and 1150c, adhesive layer 1110 with openings 1171a and 1181a, and cosmetic cap 190 with openings 1171b and 1171b. End cap assembly 1100 may be inserted into the bottom end of housing 120 to protect the components of electronic device 100 and in particular, first assembly 805, from damage and contamination. In some embodiments, jack 170 may be inserted into housing 120 and coupled to first assembly 805 after first assembly 805 has been inserted into housing 120. In some embodiments, electronic device 100 may include another end cap assembly, as described further below with respect to FIG. 12A, which may be inserted into the top end of housing 120 to protect electronic device 100 and in particular, second assembly 807.

End cap 1120 may include any suitable material, including for example, metal, plastic, ceramic, a composite, or a combination of any suitable materials, to protect first assembly 805 while providing exterior access to connector 180. For example, end cap 1120 may be made of zinc. End cap 1120 may include opening 1180 through which a user of electronic device 100 may couple connector 180 to any suitable power source (e.g., a charging dock) or any other suitable component (e.g., a cable).

End cap assembly 1100 may be used to secure connector 180 and jack 170, and in the process to also ground connector 180 and jack 170, to housing 120 using any suitable approach. For example, end cap assembly 1100 may include any suitable fastener to secure end cap 1120 to connector 180 and jack 170 and thereafter to housing 120, including for example metal screws 1150a, 1150b, and 1150c. Screw 1150a may be inserted into hole 1140a in jack 170 and into housing 120 to secure jack 170 within housing 120. Because screw 1150a may include metal, screw 1150a may ground jack 170 to housing 120 by electrically connecting jack 170 to housing 120. Screw 1150c may be inserted into hole 1140d in end cap 1120 and thereafter into housing 120 to secure end cap 1120 to housing 120. Because screw 1150c may include metal, screw 1150c may ground end cap 1120 to housing 120 by electrically connecting end cap 1120 to housing 120. Screw 1150b may be inserted into hole 1140b of end cap 1120, through hole 1140c of jack 170, and into connector 180 to secure jack 170 to connector 180. Screw 1150b may ground connector 180 to housing 120 because end cap 1120 may be grounded to housing 120 through screw 1150c. In addition, connector 180 may be grounded to housing 120 because connector 180 may be mounted to circuit panel portion 650a, which may in turn be coupled to frame 840 that may be grounded to housing 120 through spring fingers 843 (FIG. 9).

Once end cap 1120 has been coupled to connector 180, jack 170 and housing 120, a cosmetic end cap 190 may be coupled to end cap 1120 using any suitable approach. For example, an adhesive layer 1110 may be applied to end cap 1120, to which cosmetic end cap 190 may adhere. Cosmetic end cap 190 may include any suitable material, including for example plastic. Cosmetic end cap 190 may be coupled to electronic device 100 to protect end cap 1120 and to present an aesthetically appealing surface to a user of electronic device 100. Each of adhesive layer 1110 and cosmetic end cap 190 may include openings 1181a and 1181b, which may have the same dimensions as opening 1180 in end cap 1120, to provide exterior access to connector 180 to a user of electronic device 100. Each of adhesive layer 1110 and cosmetic end cap 190 may also include openings 1171a and 1171b, which may have the same dimensions as opening 1170 of jack 170, through which a user may have access to jack 170. A user of electronic device 100 may couple any suitable component (e.g., headphones or a microphone) to jack 170 to send or receive audio data.

Figure 12A:
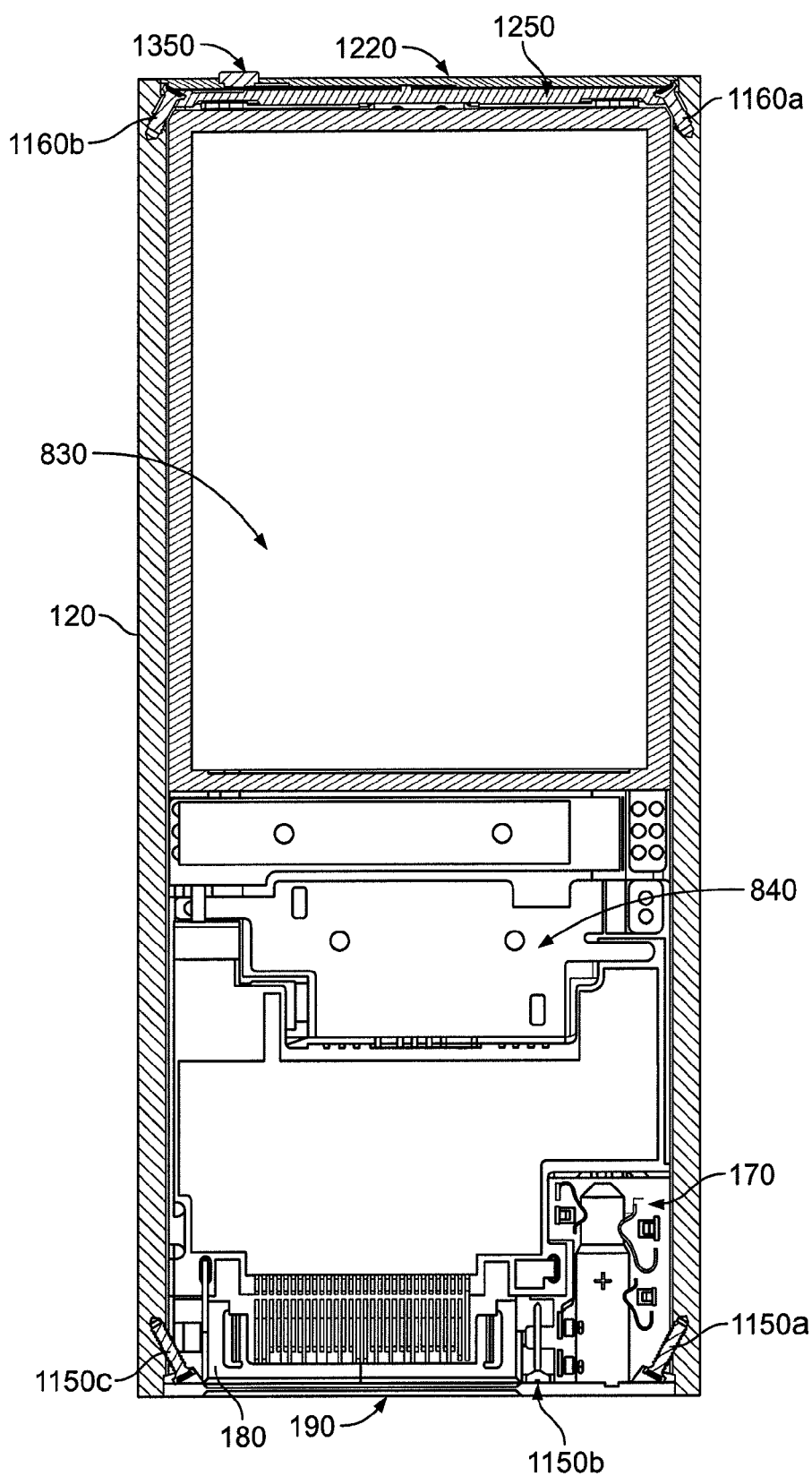
FIG. 12A is a front view of a portion of an electronic device in accordance with some embodiments of the invention.

FIG. 12A is a front view of a portion of electronic device 100 after insertion of two end cap assemblies in accordance with some embodiments of the invention. At the bottom of electronic device 100, screw 1150a may be inserted through hole 1140a of jack 170 and into housing 120. Screw 1150b may be inserted through hole 1140b of end cap 1120 and through hole 1140c of jack 170 into connector 180. Screw 1150c may be inserted through hole 1140d of end cap 1120 and into housing 120. Cosmetic end cap 190 may be applied over end cap 1120 such that screws 1150a, 1150b, and 1150c may not be seen by a user of electronic device 100. Screws 1150a and 1150c may be inserted into housing 120 at any suitable angle relative to the sidewalls of housing 120. Screws 1150a and 1150c may be inserted into housing 120 at an angle because the thickness of the sidewalls of housing 120 may not provide sufficient material to permit screws 1150a and 1150c to be inserted parallel to the sidewalls.

At the top end of electronic device 100, another end cap assembly may be inserted to protect the components of second assembly 807. The end cap at the top of electronic device 100 (not shown) may be similar to end cap 1120 (e.g., a zinc end cap), but may include holes for two screws 1160a and 1160b and an opening through which hold switch 1350 may emerge from housing 120 to be accessed by a user of electronic device 100. Screws 1160a and 1160b, which may be the same as screws 1150a, 1150b, and 1150c, may be inserted through the end cap at the top of electronic device 100, through a frame 1250 that may enclose output mechanism 830, and into housing 120 at any suitable angle relative to the sidewalls of housing 120. Screws 1160a and 1160b, which may be metal, may ground both the end cap at the top of electronic device 100 and the output mechanism frame 1250 to housing 120 because screws 1160a and 1160b may be in electrical and physical contact with housing 120. Cosmetic end cap 1220, which may be similar to cosmetic end cap 190, may be adhered to the end cap at the top of electronic device 100 using any suitable method (e.g., using an adhesive similar to adhesive layer 1110).

Cosmetic end cap 1220 may also include any suitable opening through which hold switch 1350 may emerge to be accessed by a user of electronic device 100. Hold switch 1350 may be grounded to housing 120 using any suitable approach, including for example, coupling hold switch 1350 to a metal slider (not shown) that may rest against cosmetic end cap 1220. Hold switch 1350 may include a hold switch such as that described in Sanford, U.S. patent application Ser. No. 12/180,315, filed Jul. 25, 2008, which is hereby incorporated by reference herein in its entirety.

Figure 12B:
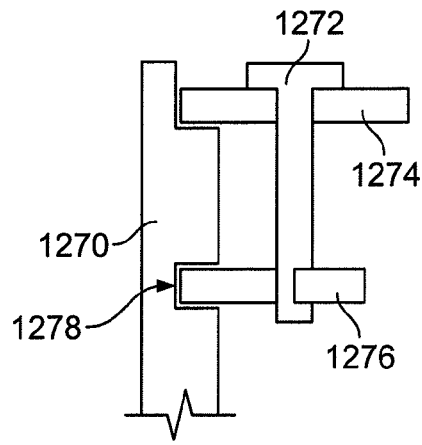
FIG. 12B is a cross-sectional view of a portion of an end cap assembly in accordance with some embodiments of the invention.

Any other suitable method may be used for securing an end cap of an electronic device to the housing of the electronic device. FIG. 12B is a cross-sectional view of a portion of an end cap assembly in accordance with some embodiments of the invention. For example, a screw 1272 may be inserted through an end cap 1274 and into a housing 1270 parallel to the sidewalls of housing 1270. As screw 1272 is inserted, it may engage a cam 1276. As screw 1272 is rotated further into housing 1270, the engaged cam may be inserted into a groove 1278 machined into housing 1270, and groove 1278 may be being perpendicular to the insertion of screw 1272. The combination of screw 1272 engaged to cam 1276 and cam 1276 inserted into groove 1278 may serve to secure end cap 1274 to housing 1270.

Figure 12C:
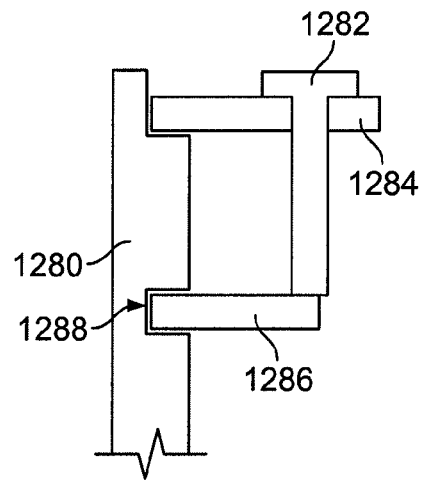
FIG. 12C is a cross-sectional view of a portion of an end cap assembly in accordance with some embodiments of the invention.

FIG. 12C is a cross-sectional view of a portion of an alternative end cap assembly in accordance with some embodiments of the invention. Any suitable number of screws, including for example, screw 1282 may be inserted through an end cap 1284 and into housing 1280, which may be parallel to the sidewalls of housing 1280, for example. As screw 1282 is inserted into housing 1280, screw 1282 may contact a lock 1286 that may be positioned within housing 1280 perpendicular to the sidewalls of housing 1280 and to the insertion of screw 1282. Once contacted by screw 1282, lock 1286 may be triggered to extend into a groove 1288 in housing 1280, and groove 1288 may also be perpendicular to the insertion of screw 1282, thereby securing end cap 1284 to housing 1280.

Figure 12D:
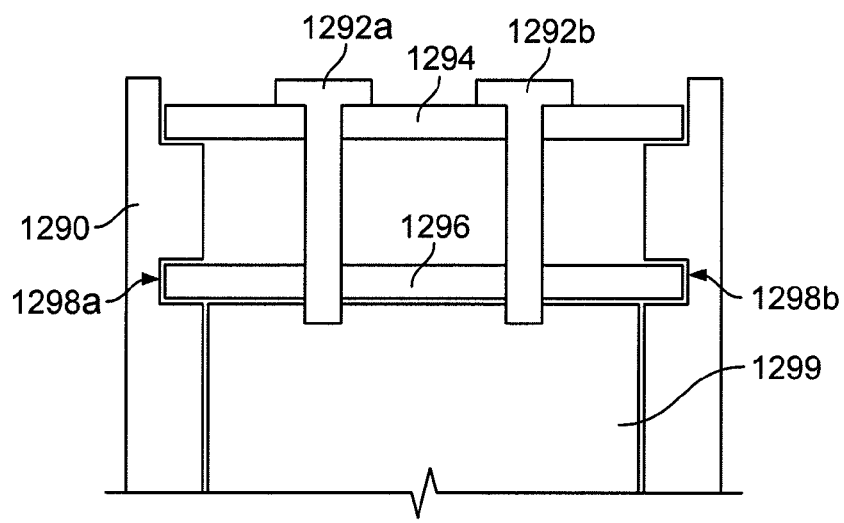
FIG. 12D is a cross-sectional view of a portion of an end cap assembly in accordance with some embodiments of the invention.

FIG. 12D is a cross-sectional view of a portion of an alternative end cap assembly in accordance with some embodiments of the invention. Any suitable number of screws, including for example, screws 1292a and 1292b may be inserted through an end cap 1294 and into housing 1290, at a portion which may be parallel to the sidewalls of housing 1290. Screws 1292a and 1292b may pass through a snap plate 1296 whose width may exceed the width of the cavity of housing 1290. The edges of snap plate 1296 may be inserted into grooves 1298a and 1298b of housing 1290 to accommodate the extra width of snap plate 1296. Grooves 1298a and 1298b may be perpendicular to the insertion of screws 1292a and 1292b. After screws 1292a and 1292b pass through snap plate 1296, screws 1292a and 1292b may engage with an output mechanism 1299 (e.g., a liquid crystal display) and may cause output mechanism 1299 to be pulled upward towards screws 1292a and 1292b and into contact with snap plate 1296. As a result, screws 1292a and 1292b may hold end cap 1294 in place with respect to housing 1290 because screws 1292a and 1292b may be in tension with output mechanism 1299, which may contact snap plate 1296 that may be inserted into grooves 1298a and 1298b in housing 1290.

Figure 13:
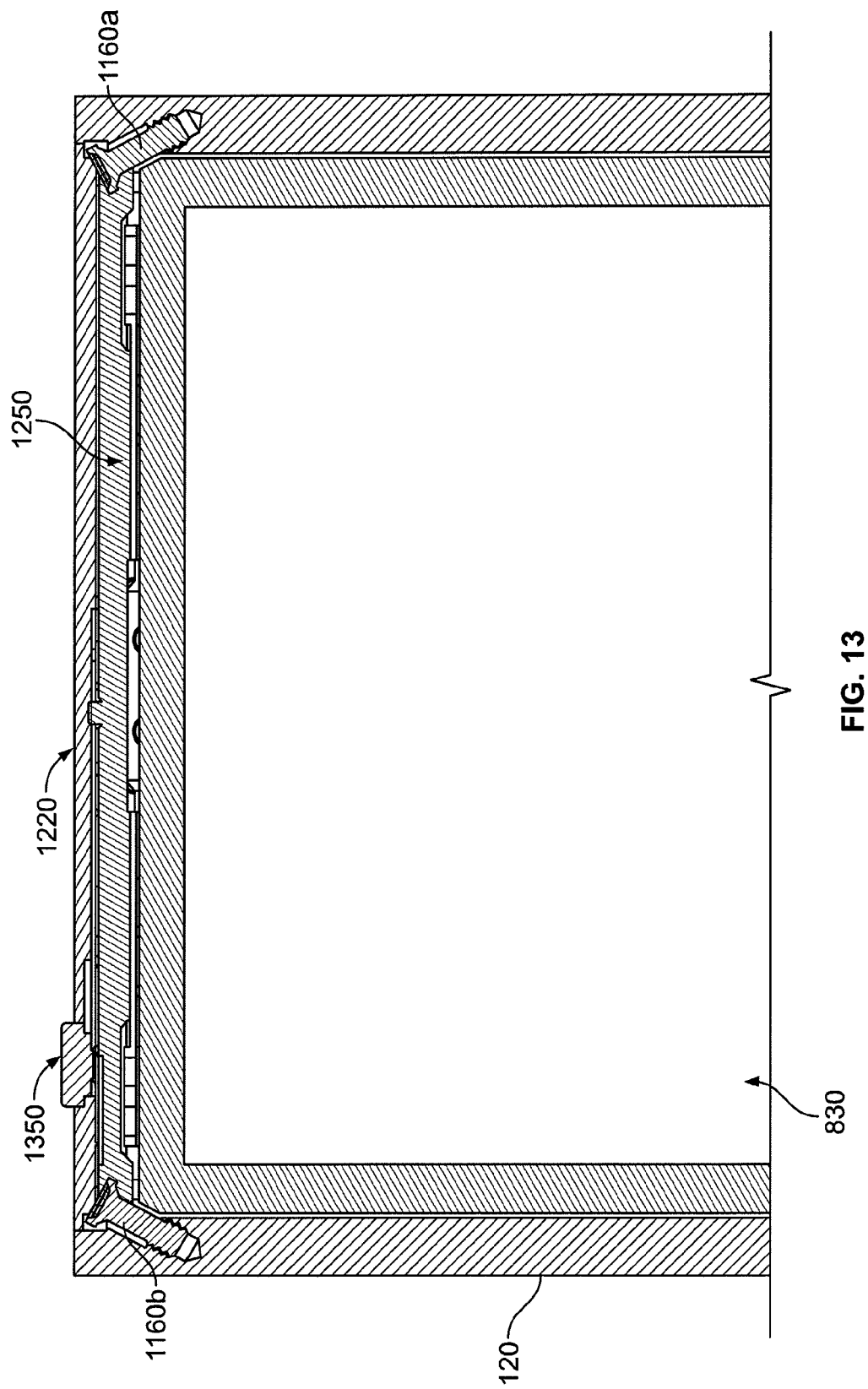
FIG. 13 is an enlarged view of a portion of the front view of the electronic device of FIG. 12A in accordance with some embodiments of the invention.

FIG. 13 is an enlarged view of a portion of the front view of electronic device 100 in accordance with some embodiments of the invention. Screws 1160a and 1160b may be inserted through an end cap at the top of electrical device 100 and into housing 120. The holes in housing 120 to receive screws 1160a and 1160b may be machined to any suitable depth and at any suitable angle. Cosmetic end cap 1220 may be adhered to the end cap at the top of electronic device 100 to protect the non-cosmetic zinc end cap and screws 1160a and 1160b, while also providing an aesthetically appealing outward appearance to a user of electronic device 100. The zinc end cap and cosmetic end cap 1220 may include any suitable opening to permit hold switch 1350 to emerge from housing 120. Hold switch 1350 may prevent electronic device 100 from being operated when hold switch 1350 is engaged by the user.

Figure 14:
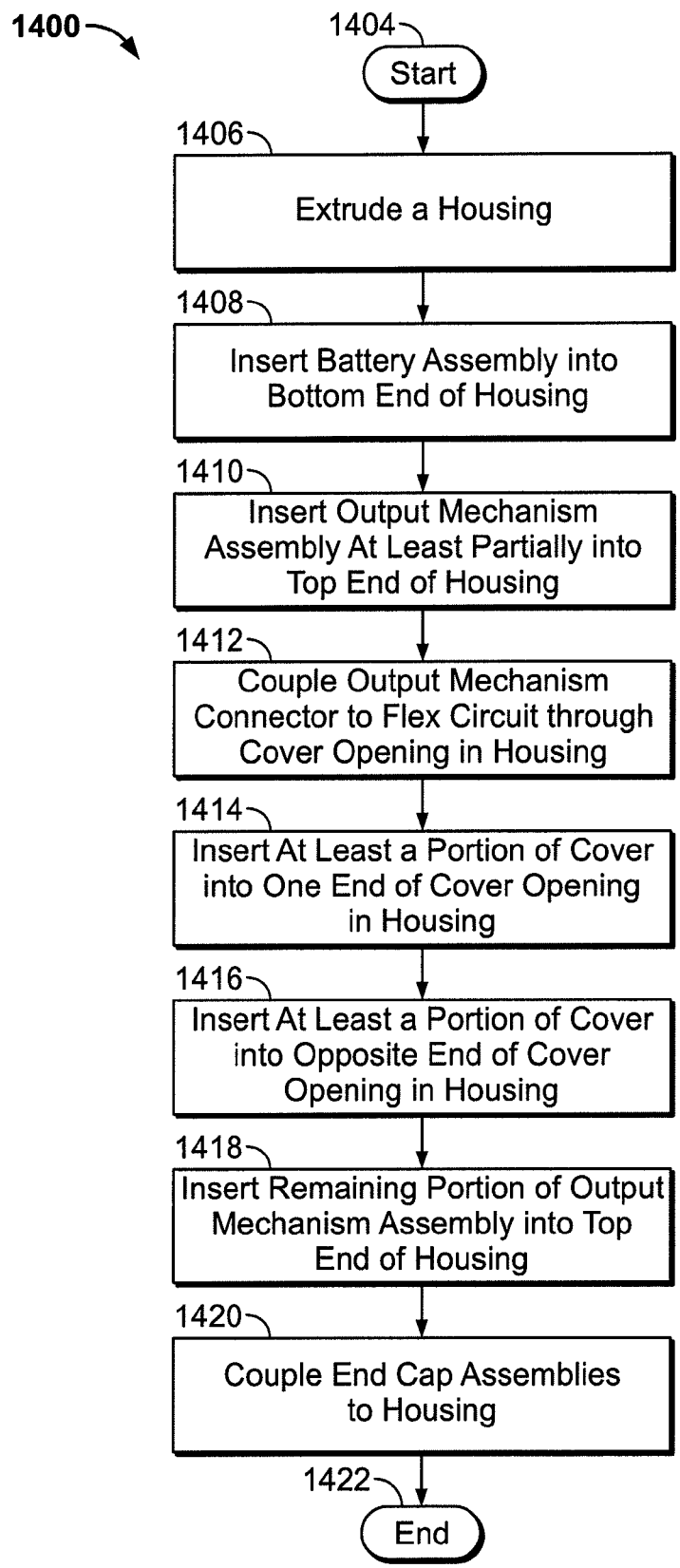
FIG. 14 is a flowchart of an illustrative process for assembling an electronic device in accordance with some embodiments of the invention.

FIG. 14 is a flowchart of an illustrative process for assembling an electronic device in accordance with some embodiments of the invention. Process 1400 may begin at step 1404. At step 1406, a housing may be extruded using any suitable approach. For example, housing 120 may be extruded from a single piece of anodized aluminum. Housing 120 may include any suitable cross-section, including an asymmetrical cross-section designed to accommodate all of the components necessary to electronic device 100. In some embodiments (not shown), an input mechanism may be coupled to both the housing and a gimbal plate using any suitable approach. For example, input mechanism 140 may be attached to surface 220a, and at least a portion of input mechanism 140 may penetrate housing 120. Input mechanism 140 may also be attached to gimbal plate 400 using any suitable approach, including, for example, using an adhesive. Input mechanism 140 may include wheel 320, button 340, and pad 360.

Process 1400 may advance to step 1408, where a first assembly may be inserted into the bottom end of the housing using any suitable approach. For example, first assembly 805, that may include circuit panel portion 650a, battery 810, flex circuit 865, connector 180 and in some embodiments, jack 170, may be slid into housing 120 through opening 850a. In some embodiments, jack 170 may be inserted with an end cap assembly into housing 120 as part of step 1420. At step 1410, at least a portion of a second assembly may be inserted into the top end of the housing using any suitable approach. For example, second assembly 807, which may include output mechanism 830, frame 1250, foam cushioning 1020, and ZIF connector 867, may be slid at least partially into housing 120 through opening 850b such that at least a portion of second assembly 807 may still emerge from housing 120 through opening 850b.

Process 1400 may advance to step 1412, where the second assembly may be coupled to the first assembly through an opening in the housing meant for a cover using any suitable approach. For example, ZIF connector 867 may be connected to flex circuit 865 so that circuit panel portion 650a may interface with output mechanism 830. ZIF connector 867 may be connected to flex circuit 865 through opening 860, into which cover 160 may be inserted in steps 1414 and 1416.

At step 1414, at least a portion of a cover for the electronic device may be inserted into the housing using any suitable approach. For example, cover 160, including flange 520a, may be inserted at any suitable angle into the end of opening 860 nearest to opening 850a. Cover 160 may be positioned over the connection between ZIF connector 867 and flex circuit 865 so as to prevent the connection from emerging out of opening 860. At step 1416, at least a portion of the cover may be inserted into the opposite end of the housing from which the cover may have been inserted in step 1414. For example, the portion of cover 160 remaining outside of opening 860, including flange 520b, may be lowered into opening 860 and slid toward opening 850b of housing 120. Flange 520a and flange 520b may secure cover 160 in opening 860 by providing a reference for positioning cover 160 relative to housing 120.

Process 1400 may advance to step 1418, where the portion of the second assembly that may remain outside of the housing may be inserted into the housing using any suitable approach. For example, second assembly 807 may be slid completely into housing 120 through opening 850b and output mechanism 830 may be positioned underneath cover 160. The connection between ZIF connector 867 and flex circuit 865 may be positioned within housing 120 such that flex circuit 865 forms a service loop as ZIF connector 867 moves further into housing 120.

Process 1400 may advance to step 1420, where end cap assemblies may be coupled to the ends of the housing to protect the components within the housing using any suitable approach. For example, end cap assembly 1100, which may include end cap 1120, adhesive layer 1110, cosmetic end cap 190, and screws 1150a, 1150b, and 1150c, may be assembled with electronic device 100 at opening 850a. End cap 1120 may be attached to connector 180 and jack 170 using screw 1150b that may also ground connector 180 to housing 120. End cap 1120 may be attached to, and grounded to, housing 120 using screw 1150c. Jack 170 may be attached to, and grounded to, housing 120 using screw 1150a. Cosmetic end cap 190 may be attached to end cap 1120 using adhesive layer 1110. A similar end cap assembly, including an end cap, an adhesive layer, a cosmetic end cap, and any suitable number of screws (e.g., two screws) may be assembled with electronic device 100 at opening 850b. The end cap assembly coupled to electronic device 100 at opening 850b may ground output mechanism 830, hold switch 1350, and a frame enclosing output mechanism 830 to housing 120, in addition to grounding the end cap assembly to housing 120. Process 1400 may then advance to step 1422 and end. It is to be understood that one or more of the steps described above as part of process 1400 may be omitted from process 1400 and the steps described above may be performed in any suitable order.

While there have been described apparatus and methods for producing components of an electronic device and assembling an electronic device, it is to be understood that many changes may be made therein without departing from the spirit and scope of the invention. It will also be understood that various directional and orientational terms such as "up" and "down," "left" and "right," "top" and "bottom," "side" and "edge" and "corner," "height" and "width" and "depth," "horizontal" and "vertical," and the like are used herein only for convenience, and that no fixed or absolute directional or orientational limitations are intended by the use of these words. For example, the positioning of an output mechanism and/or an input mechanism within an electronic device may have any desired orientation. If reoriented, different directional or orientational terms may need to be used in their description, but that will not alter their fundamental nature as within the scope of the invention. Those skilled in the art will appreciate that the invention can be practiced by other than the described embodiments, which are presented for purposes of illustration rather than of limitation, and the invention is limited only by the claims which follow.

What is claimed is:

1. A glass cover for use in a portable electronic device, comprising:
   a rectangular glass component comprising two sets of parallel edges;
   a first flange extending from a first edge of the rectangular glass component, the first flange having a first width smaller than a width of the first edge and defining a flange base extending from, and coplanar with, a base of the rectangular glass component;
   a second flange extending from a second edge of the rectangular glass component, the second flange having a second width smaller than a width of the second edge, wherein the second edge and the first edge are provided at opposite sides of the rectangular glass component, and wherein the first flange and the second flange are positioned in an opening of a housing of the portable electronic device; and
   a polished outer surface of the rectangular glass component between the first edge and the second edge,
   wherein the first flange and second flange are configured to assist in securing the rectangular glass component relative to the opening of the housing of the portable electronic device.

2. The glass cover of claim 1, wherein:
   the length of the cover is in the range of 43.56 millimeters and 43.62 millimeters.

3. The glass cover of claim 1, wherein:
   the width of the cover is in the range of 33.60 millimeters and 33.66 millimeters.

4. The glass cover of claim 1, wherein:
   the height of the cover is no more than 1.63 millimeters.

5. The glass cover of claim 1, wherein:
   the flanges on each of the two opposite edges have a length of 25.86 millimeters.

6. The glass cover of claim 1, wherein the flanges on each of the two opposite edges have a height in the range of 0.62 millimeters to 0.68 millimeters.

7. The glass cover of claim 1, wherein:
   the first flange is positioned on a first side of the opening; and
   the second flange is positioned on a second side of the opening, the first side opposite the second side.

8. The glass cover of claim 1, wherein a periphery of the polished outer surface is flush with a surface of the housing.

9. The glass cover of claim 1, wherein the rectangular glass component is transparent.

10. The glass cover of claim 1, wherein the rectangular glass component is formed from a scratch resistant material.

11. The glass cover of claim 1, further comprising:
    a third flange extending from a third edge of the rectangular glass component; and
    a fourth flange extending from a fourth edge of the rectangular glass component,
    wherein the third edge and the fourth edge are in the other set of parallel edges.

12. A portable electronic device, comprising:
    a housing having an opening and at least two reference openings on opposing ends of the opening; and
    a glass cover configured to be received within the opening and comprising:
    a rectangular glass component comprising two sets of parallel edges;
    a first flange extending from a first edge of the rectangular glass component, the first flange having a first width smaller than a width of the first edge and defining a flange portion extending from the rectangular glass component having a bottom surface contiguous with a bottom surface of the rectangular glass component;
    a second flange extending from a second edge of the rectangular glass component, the second flange having a second width smaller than a width of the second edge, wherein the second edge and the first edge are in a set of parallel edges; and
    a polished curved surface defined by a spline projected along an axis of the rectangular glass component, wherein the axis extends along an edge of the rectangular glass component between the first edge and the second edge,
    wherein the first flange and second flange are configured to be respectively received in the at least two reference openings.

13. The portable electronic device of claim 12, wherein the glass cover is configured to be disposed over a display of the portable electronic device.

14. The portable electronic device of claim 12, wherein the first flange includes at least one additional flange, and wherein the second flange includes at least one additional flange.

15. The portable electronic device of claim 12, wherein edges of the polished curved surface are flush with a surface of the housing.

16. The portable electronic device of claim 12, further comprising:
    a third flange extending from a third edge of the rectangular glass component; and
    a fourth flange extending from a fourth edge of the rectangular glass component, wherein the third edge and the fourth edge are in another set of parallel edges.

17. The portable electronic device of claim 12, wherein the length of the cover is about 43 millimeters.

18. The portable electronic device of claim 12, wherein the width of the cover is about 33 millimeters.

19. The portable electronic device of claim 12, wherein the height of the cover is no more than 1.63 millimeters.

20. The glass cover of claim 1, wherein the polished outer surface is a curved surface.

21. The glass cover of claim 20, wherein the curved surface is defined by a spline projected along an axis of the rectangular glass component, wherein the axis extends along an edge of the rectangular glass component between the first edge and the second edge.

22. A portable electronic device, comprising:
    a housing having an opening and at least two reference openings on opposing ends of the opening;
    a display provided within the housing; and
    a glass cover configured to be received within the opening of the housing and positioned over the display of the portable electronic device, the glass cover providing a user interface surface, and the glass cover including at least:
    a rectangular glass component comprising two sets of parallel edges;
    a first flange extending from a first edge of the rectangular glass component, the first flange having a first width smaller than a width of the first edge and defining a flange member extending from, and having a bottom surface coplanar with, a bottom surface of the rectangular glass component;

a second flange extending from a second edge of the rectangular glass component, the second flange having a second width smaller than a width of the second edge, wherein the second edge and the first edge are provided at opposite sides of the rectangular glass component; and a polished outer surface of the rectangular glass component between the first edge and the second edge, wherein the first flange and second flange are configured to assist in securing the rectangular glass component relative to the opening of the housing of the portable electronic device.

\* \* \* \* \*